(12) United States Patent
Nakamura

(10) Patent No.: US 8,185,849 B2
(45) Date of Patent: May 22, 2012

(54) ELECTRIC INFORMATION PROCESSING METHOD IN CAD SYSTEM, DEVICE THEREOF, PROGRAM, AND COMPUTER READABLE STORAGE MEDIUM

(75) Inventor: Satoshi Nakamura, Yokohama (JP)

(73) Assignee: Zuken Inc., Kanagawa (JP)

( * ) Notice: Subject to any disclaimer, the term of this patent is extended or adjusted under 35 U.S.C. 154(b) by 326 days.

(21) Appl. No.: 12/438,305

(22) PCT Filed: Oct. 10, 2007

(86) PCT No.: PCT/JP2007/069757
§ 371 (c)(1),
(2), (4) Date: Aug. 7, 2009

(87) PCT Pub. No.: WO2008/047644
PCT Pub. Date: Apr. 24, 2008

(65) Prior Publication Data
US 2010/0180248 A1 Jul. 15, 2010

(30) Foreign Application Priority Data
Oct. 11, 2006 (JP) ................. 2006-277663

(51) Int. Cl.
*G06F 9/45* (2006.01)
(52) U.S. Cl. ........ 716/103; 716/101; 716/106; 716/119; 716/110
(58) Field of Classification Search .............. 716/51, 716/101, 103, 106, 110, 119
See application file for complete search history.

(56) References Cited

U.S. PATENT DOCUMENTS

| | | | | |
|---|---|---|---|---|
| 5,996,736 A | * | 12/1999 | Stankiewicz | 182/127 |
| 6,006,024 A | * | 12/1999 | Guruswamy et al. | 716/126 |
| 6,629,307 B2 | | 9/2003 | Erickson et al. | |
| 7,823,113 B1 | * | 10/2010 | Waller et al. | 716/129 |
| 2004/0128638 A1 | | 7/2004 | Kerzman et al. | |
| 2005/0080502 A1 | | 4/2005 | Chernyak et al. | |
| 2005/0091626 A1 | | 4/2005 | Okano et al. | |

FOREIGN PATENT DOCUMENTS

| | | |
|---|---|---|
| DE | 10230135 A1 | 4/2003 |
| JP | 2003-76731 | 3/2003 |
| JP | 2006-252303 | 9/2006 |

* cited by examiner

*Primary Examiner* — Nghia Doan
*Assistant Examiner* — Brian Ngo
(74) *Attorney, Agent, or Firm* — Muncy, Geissler, Olds & Lowe, PLLC

(57) ABSTRACT

It is possible to improve workability of a design work by handling electric information between one object and other objects associated with the object. A plurality of objects are inputted and electric information is inputted to the objects. Among the objects, mutually connected objects are virtually made into a single object. According to electric information in each of the objects, i.e., the virtually unified single object and the other objects excluding the virtually unified single object, objects having the common electric information are connected by straight lines. According to the straight lines, a figure connecting the objects is inputted. A condition for connecting the objects in the figure is inputted. According to the condition, circuit parts are built and signal information is set in a terminal of the circuit parts.

10 Claims, 43 Drawing Sheets

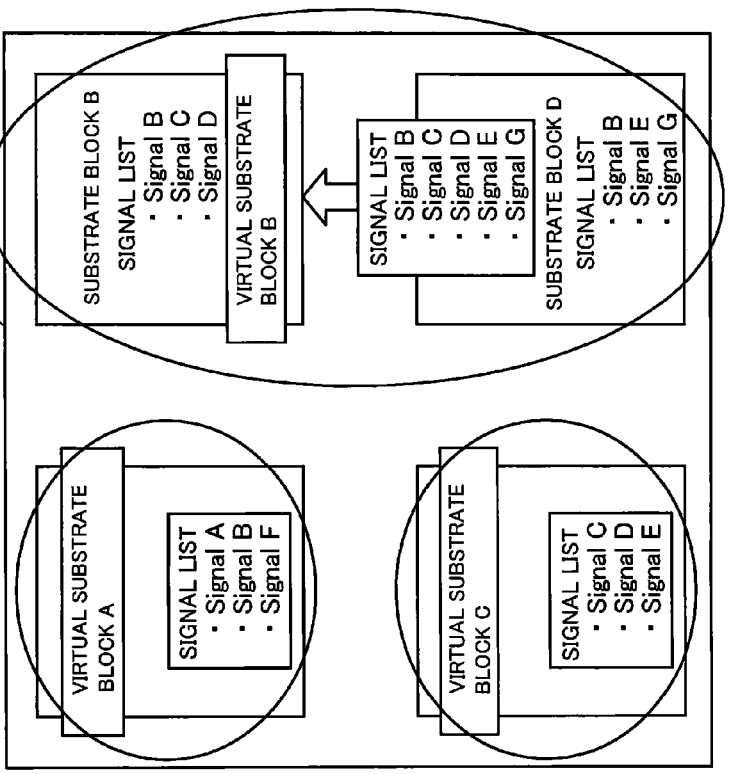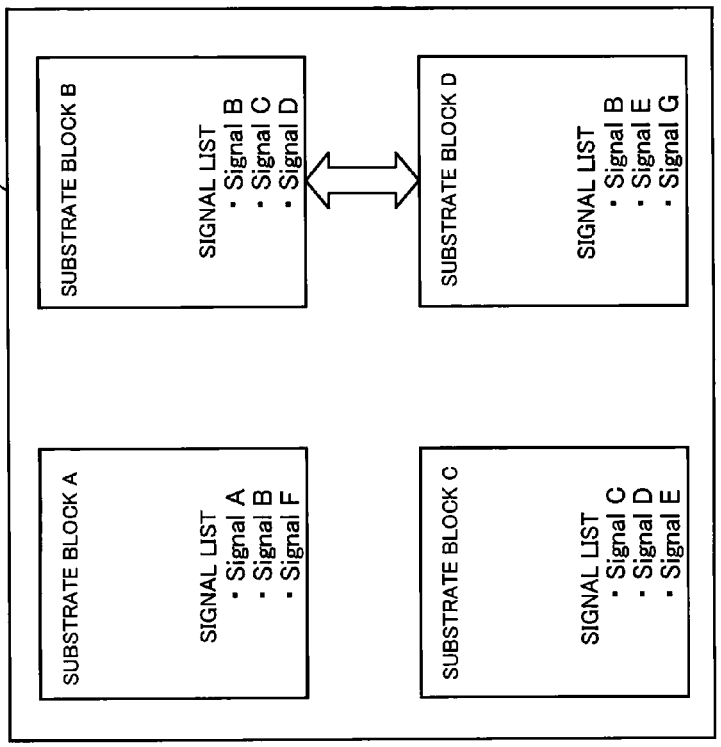

FIG. 23

| SIGNAL NAME | SIGNAL TYPE | CONNECTION DESTINATION | | | CONNECTION DESTINATION | | |
|---|---|---|---|---|---|---|---|
| | | BLOCK NAME | PART NAME | TERMINAL NAME | BLOCK NAME | PART NAME | TERMINAL NAME |
| Signal A | Normal | SUBSTRATE BLOCK A | CONNECTOR PART A | TermA-4 | SUBSTRATE BLOCK B | CONNECTOR PART B | TermB-1 |
| Signal B | Normal | SUBSTRATE BLOCK A | CONNECTOR PART A | TermA-5 | SUBSTRATE BLOCK B | CONNECTOR PART B | TermB-4 |
| Signal C | Normal | SUBSTRATE BLOCK A | CONNECTOR PART A | TermA-6 | SUBSTRATE BLOCK B | CONNECTOR PART B | TermB-7 |

FIG. 25

| SIGNAL NAME | SIGNAL TYPE | CONNECTION DESTINATION | | | CONNECTION DESTINATION | | |
|---|---|---|---|---|---|---|---|
| | | BLOCK NAME | PART NAME | TERMINAL NAME | BLOCK NAME | PART NAME | TERMINAL NAME |
| Signal B | Normal | SUBSTRATE BLOCK A | CONNECTOR PART A | TermA-2 | SUBSTRATE BLOCK B | CONNECTOR PART B | TermB-1 |
| Signal C | Normal | SUBSTRATE BLOCK A | CONNECTOR PART A | TermA-1 | SUBSTRATE BLOCK B | CONNECTOR PART B | TermB-2 |

FIG. 28

| SIGNAL NAME | SIGNAL TYPE | CONNECTION DESTINATION | | | CONNECTION DESTINATION | | |
|---|---|---|---|---|---|---|---|
| | | BLOCK NAME | PART NAME | TERMINAL NAME | BLOCK NAME | PART NAME | TERMINAL NAME |
| Signal B | Normal | SUBSTRATE BLOCK A | CONNECTOR PART A | TermA-2 | SUBSTRATE BLOCK B | CONNECTOR PART B | TermB-1 |
| Signal C | Normal | SUBSTRATE BLOCK A | CONNECTOR PART A | TermA-1 | SUBSTRATE BLOCK B | CONNECTOR PART B | TermB-2 |

COMMA DELIMINATION

Signal B, Normal, SUBSTRATE BLOCK A, CONNECTOR PART A, TermA-2, SUBSTRATE BLOCK B, CONNECTOR PART B, TermB-1

Signal C, Normal, SUBSTRATE BLOCK A, CONNECTOR PART A, TermA-1, SUBSTRATE BLOCK B, CONNECTOR PART B, TermB-2

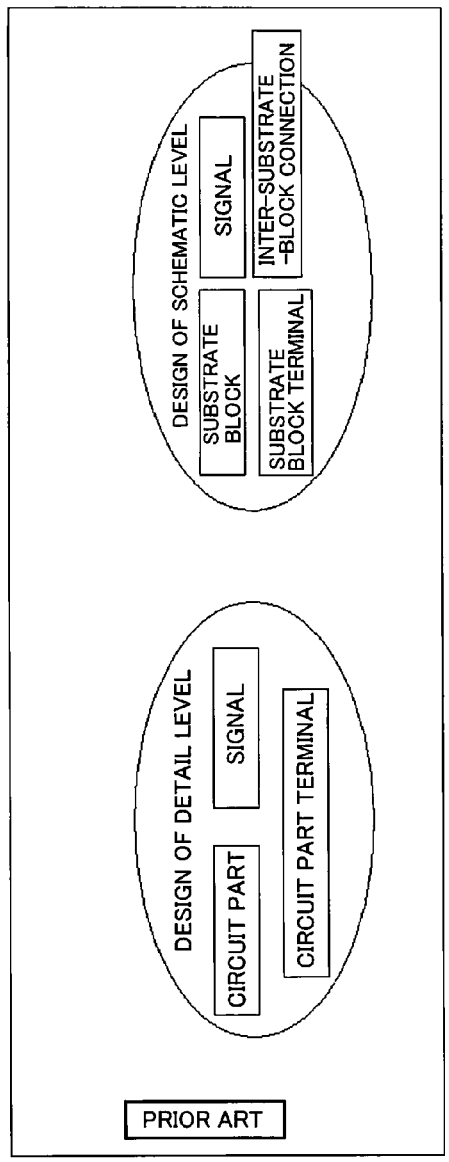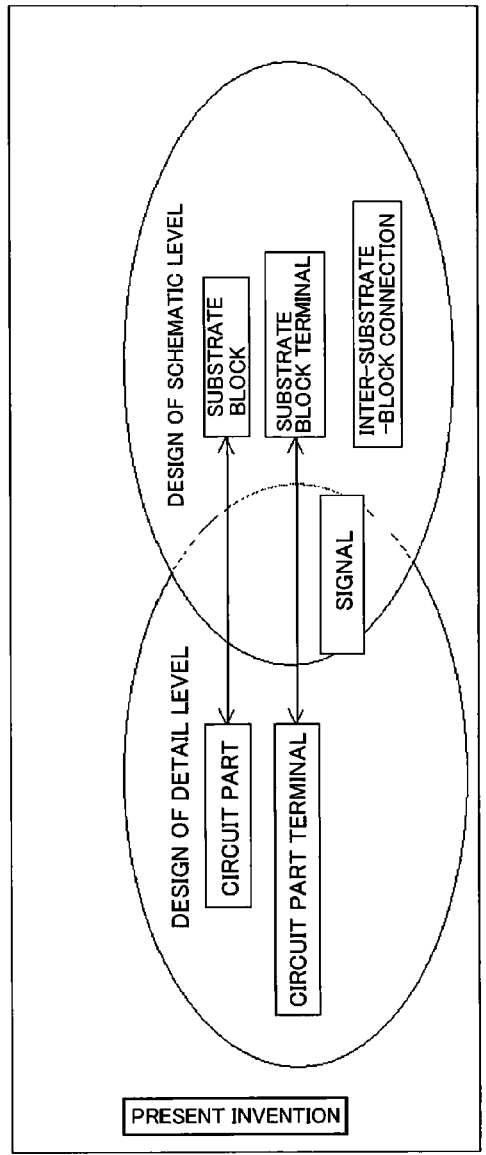
FIG. 30(a)
FIG. 30(b)

FIG. 31

| | ELEMENT BLOCK | PHYSICAL BLOCK | PHYSICAL BLOCK TERMINAL | PHYSICAL BLOCK CONNECTION INFORMATION | ELECTRIC INFORMTION |
|---|---|---|---|---|---|
| EMBODIMENT | ELECTRIC TERMINAL | | | | |
| | CIRCUIT PART | CIRCUIT PART TERMINAL | SUBSTRATE BLOCK | SUBSTRATE BLOCK TERMINAL | INTER-SUBSTRATE-BLOCK CONNECTION | SIGNAL |
| PACKAGE SUBSTRATE | SEMICONDUCTOR CHIP | SEMICONDUCTOR CHIP TERMINAL | PACKAGE SUBSTRATE BLOCK | PACKAGE SUBSTRATE BLOCK TERMINAL | INTER-PACKAGE-SUBSTRATE-BLOCK CONNECTION | SIGNAL |
| MODULE | MODULE PART | MODULE PART TERMINAL | UNIT BLOCK | UNIT BLOCK TERMINAL | INTER-UNIT-BLOCK CONNECTION | SIGNAL |
| | EXPRESSES ITEMS THAT CONSTITUTE ELECTRONIC PRODUCTS | EXPRESSES EXISTENCE OF ELECTRIC INTERFACE | EXPRESSES UNIT OF CERTAIN MOUNTING | EXPRESSES EXISTENCE OF ELECTRIC INTERFACE IN PHYSICAL BLOCK | EXPRESSES EXISTENCE OF ELECTRIC RELATION BETWEEN PHYSICAL BLOCKS | EXPRESSES ELECTRIC PROPERTY |

ELECTRIC INFORMATION PROCESSING METHOD IN CAD SYSTEM, DEVICE THEREOF, PROGRAM, AND COMPUTER READABLE STORAGE MEDIUM

TECHNICAL FIELD

The present invention relates to an electric information processing method in CAD system, a device thereof, a program and a computer-readable storage medium, more particularly the invention relates to an electric information processing method in CAD system, in which easiness of handling of electric information is improved, a device thereof, a program and a computer-readable storage medium.

BACKGROUND ART

Generally, an electronic product is constituted by mounting many constituent parts such as a package, a printed circuit board, interconnect, a module and chassis part (hereinafter, appropriately referred to as "object").

Functions of an electronic products are much different depending on the function of each object mounted, and since one electronic product is constituted by mounting a plurality of objects, it is extremely important for developing electronic products to consider handling electric information between each object being information showing electrical connection relation between each object such as a signal flowing between each object, for example.

Herein, in designing printed circuit boards in such an object, a printed circuit board CAD (Computer Aided Design) system is generally used.

However, since conventional printed circuit board CAD systems aimed at inputting manufacture information of one printed circuit board, electric information could only be handled in a range of a single printed circuit board, electric information with other related printed circuit boards or other objects could not be handled.

More specifically, according to conventional CAD systems, consideration of necessary electric information in a single object such as a printed circuit board and another object related to the object had to be performed by the visual observation of an operator by listing many input/output information in each object.

Then, such a confirmation work by the visual observation of an operator was very troublesome and had a problem that errors could easily occur.

It is to be noted that prior art that the present applicant knows at the point of filing a patent is as described above and not an invention according to document publicly known invention, so there is no prior art information to be described.

DISCLOSURE OF THE INVENTION

Problem to be Solved by the Invention

The present invention has been created in view of the various problems that Prior Art has, and it is an object of the present invention to provide an electric information processing method in CAD system, a device thereof, a program and a computer-readable storage medium, in which electric information between one object and another object related to the object can be dealt with and the operability of design work is improved.

Means for Solving the Problems

To achieve the above-described objects, the present invention is that a single CAD system is enabled to deal with electric information between a plurality of objects such as printed circuit board, chassis part, interconnect and module to allow the system to perform design work regarding electric information between each object.

The electric information processing method in CAD system according to the present invention is an electric information processing method in a CAD system, which has: a first processing in which a plurality of objects are inputted; a second processing in which electric information is inputted to the objects inputted by the above-described first processing; a third processing in which electrically connected objects out of the objects inputted by the above-described first processing are virtually unified; a fourth processing in which, based on the electric information in each object of the objects virtually unified by the above-described third processing and the objects inputted by the above-described first processing except for the above-described virtually unified objects, the above-described objects that should be electrically connected are connected by straight lines; a fifth processing in which a figure that connects between the above-described plurality of objects is inputted based on the straight lines connected by the above-described fourth processing; a sixth processing in which a condition for connecting between the above-described plurality of objects is inputted to the figure inputted by the above-described fifth processing; a seventh processing in which a circuit part is built according to the condition inputted by the above-described sixth processing; and a eighth processing in which signal information is set to the terminals of the above-described circuit part built by the above-described seventh processing.

Further, in the electric information processing method in CAD system according to the present invention, when the above-described plurality of objects have signal information that should be electrically connected, the above-described fourth processing is a processing in which objects having the shortest distance of arrangement out of the above-described plurality of objects are connected by straight lines in order to show that they should be electrically connected.

Further, in the electric information processing method in CAD system according to the present invention, the above-described fourth processing is a processing in which the straight line is changed such that the straight line is made thicker in proportion to the number of signal information between the above-described plurality of objects.

Further, the electric information processing method in CAD system according to the present invention is the electric information processing method in a CAD system, in which based on electric information that electrically connects between a plurality of substrates, a connector, a flex substrate or the like according to the above-described electric information is generated, and one substrate is connected with another substrate by the above-described generated connector, flex substrate or the like.

Further, in the electric information processing method in CAD system according to the present invention, when the above-described electric information electrically connecting between the above-described plurality of substrates is changed, the connector and flex substrate connecting between the above-described plurality of substrates are changed based on the change.

Further, the electric information processing unit in CAD system according to the present invention is an electric information processing unit in a CAD system, which has: first display means for displaying a plurality of objects; first input means for inputting electric information to the objects displayed by the above-described first displaying means; unifying means for virtually unifying electrically connected objects out of the objects displayed by the above-described first display means; means for connecting the above-described objects that should be electrically connected by straight lines based on the electric information in each object of the objects virtually unified by the above-described unifying means and the inputted objects in the above-described first display means except for the objects virtually unified by the above-described unifying means; second display means for displaying a figure that connects between a plurality of objects based on the straight line connected by the above-described means for connecting by straight line; second input means for inputting a condition for connecting between the above-described plurality of objects to the figure inputted by the above-described second display means; circuit part building means for building a circuit parts according to the condition inputted by the above-described second input means; and signal information setting means for setting signal information to the terminals of the above-described circuit part built by the above-described circuit part building means.

Further, in the electric information processing unit in CAD system according to the present invention, when the above-described objects have common signal information, the above-described means for connecting by straight line should be means for connecting by straight line in which objects having the shortest distance of arrangement out of the above-described objects are connected by straight lines in order to show that they should be electrically connected.

Further, the electric information processing unit in CAD system according to the present invention further has display means for displaying at least the above-described objects and the above-described straight lines, and the above-described display means changes the display of straight lines such that straight line displayed by the above-described display means is made thicker in proportion to the number of electric information that is common between the above-described objects.

Further, the program according to the present invention is a program that allows a computer to execute the electric information processing method in CAD system according to the present invention.

Further, the program according to the present invention is a program that allows a computer to function as the electric information processing unit in CAD system according to the present invention.

Further, the computer-readable storage medium according to the present invention is a computer-readable storage medium in which the program according to the present invention is recorded.

Effect of the Invention

Since the present invention is constituted as described above, electric information between one object and another object related to the object can be handled, and an excellent effect is exerted that operability of a design work can be improved.

More specifically, according to the constitution the present invention, work that was performed by the visual observation of an operator regarding electric information can be automated, for this reason, work mistake is lightened, and the entire design work can be made more efficient.

BRIEF DESCRIPTION OF THE DRAWINGS

FIG. 11(a) is a display example in which four substrate blocks are displayed on the screen of the display unit for explaining the rats display processing according to the present invention in more details, and FIG. 11(b) is a display example of a virtual substrate block in the rats display processing according to the present invention.

FIG. 23 is an explanatory view of the connecting part generating processing according to the present invention.

FIG. 25 is a display example showing the state where, by exchanging the terminals of a connector part A in substrate block A, signals associated with the terminals are changed and signals corresponding to each terminal are set.

FIG. 28 is an output example in outputting information in inter-substrate-block connection.

FIG. 30 is an explanatory view showing comparison between Prior Art and the present invention.

FIG. 31 is an explanatory view showing a modified example of the present invention.

| Explanation of Numerical Characters |
| --- |
| 10 Electric information processing unit |
| 12 Central processing unit (CPU) |
| 14 Bus |
| 16 Storage |
| 18 Display unit |
| 20 Pointing device |
| 22 Character input device |

BEST MODE FOR IMPLEMENTING THE INVENTION

Hereinafter, referring to the attached drawings, description will be made in detail for an embodiment example of the electric information processing method in CAD system, the device thereof, the program and the computer-readable storage medium according to the present invention.

Figure 1:
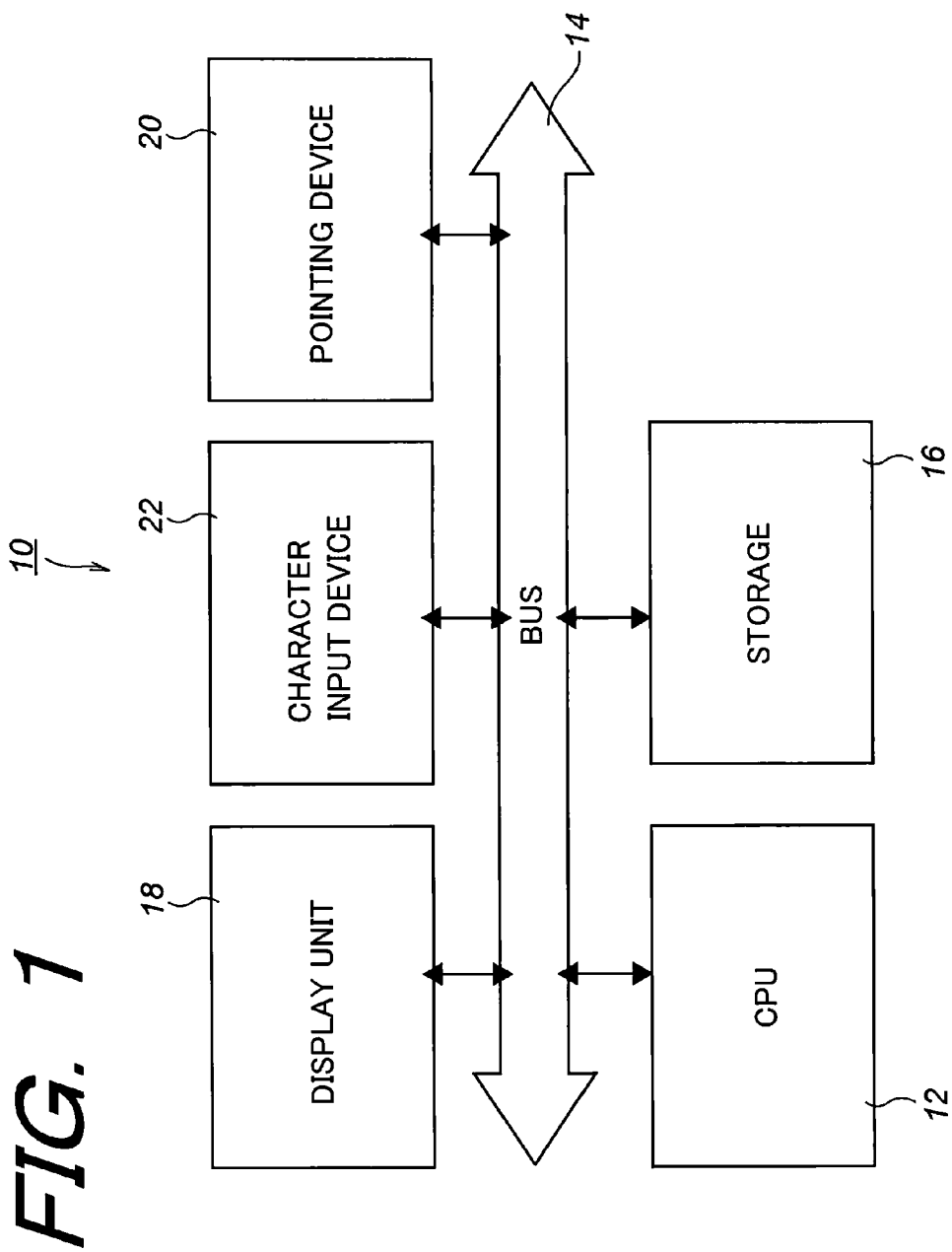
FIG. 1 is a block constitution diagram showing the system constitution of an embodiment example of an electric information processing unit in the printed circuit board CAD system according to the present invention.

FIG. 1 shows the block constitution diagram showing the system constitution of an embodiment example of the electric information processing unit in CAD system according to the present invention.

More specifically, this electric information processing unit in CAD system according to the present invention (hereinafter, appropriately referred to simply as "electric information processing unit") 10 is constituted so as to control the entire operation of the unit by using a central processing unit (CPU) 12.

To the CPU 12, a storage 16 that is constituted of a read-on memory (ROM) that stores a program for the control of the CPU 12, various types of information (described later) or the like, a random access memory (RAM) equipped with a storage region that is used as the working area of the CPU 12, a database (described later) or the like, a display unit 18 equipped with a screen such as a CRT and a liquid crystal panel, which performs various types of display based on the control of the CPU 12, a pointing device 20 such as a mouse that designates an arbitrary position on the screen of the display unit 18, and a character input device 22 such as a keyboard for inputting arbitrary characters are connected via a bus 14.

Meanwhile, in the electric information processing unit 10, by the operation of the input means such as the pointing device 20 and the character input device 22, which is done by a user who performs a design work, desired designation or setting of the user can be inputted, and display on the display unit 18 is changed in response to the operation of the pointing device 20 or the character input device 22 by the user.

In the above-described constitution, referring to the flowchart shown in FIG. 2 and each drawing on and after FIG. 3, description will be made in detail for a processing executed by the electric information processing unit 10.

Figure 2:
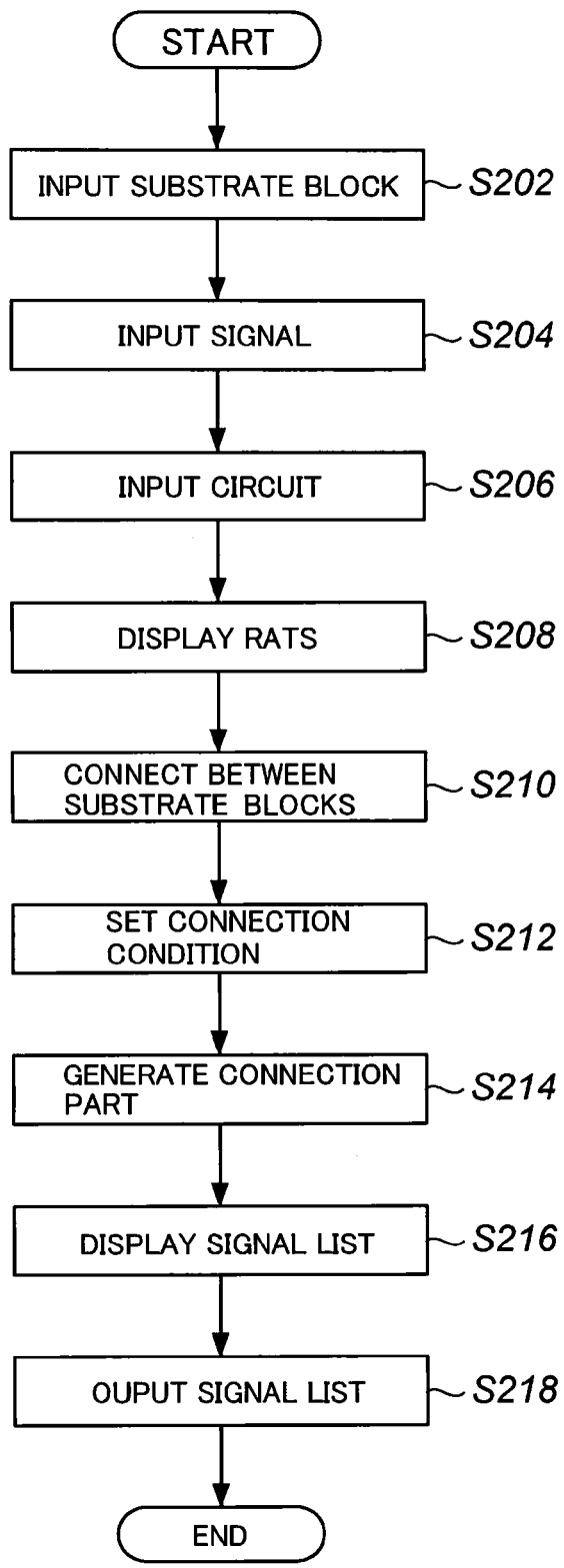
FIG. 2 is a flowchart showing the processing routine of the electric information processing unit in the printed circuit board CAD system according to the present invention.

FIG. 2 illustrates the flowchart showing the processing routine of an electric information processing method executed by the electric information processing unit 10.

First, by the user's input of a substrate block input command using the pointing device 20 or the character input device 22, execution of the processing routine of this electric information processing method is started, input of an object that should be processed is made possible on the screen of the display unit 18, and the input is performed (step S202).

Meanwhile, in this embodiment, it is assumed that one or more printed circuit boards should be inputted as the object.

Further, in showing the printed circuit board as the object in this embodiment, it is appropriately referred to as "substrate block" or simply "substrate".

Description will be specifically made for an example of the input method of a substrate block on the above-described step S202, in which vertexes of the external shape of the object (as described, the object is a substrate block in this embodiment) are clicked in order in one direction by the pointing device 20 such as a mouse, to generate straight lines between clicked points and form the external shape of the object, and the figure of object is inputted by finally clicking an origin. More specifically, as the figure of the object, a desired figure is inputted by plural points coordinate designation, for example, and as shown in FIG. 3(*a*), a substrate block A and a substrate block B are inputted and created as objects expressing the printed circuit board.

Then, a list corresponding to the objects is created in response to the input of the objects, the objects and figures that express the objects are stored and allowed to associate with each other in the database inside the storage 16 by the control of the CPU 12.

Figure 4:
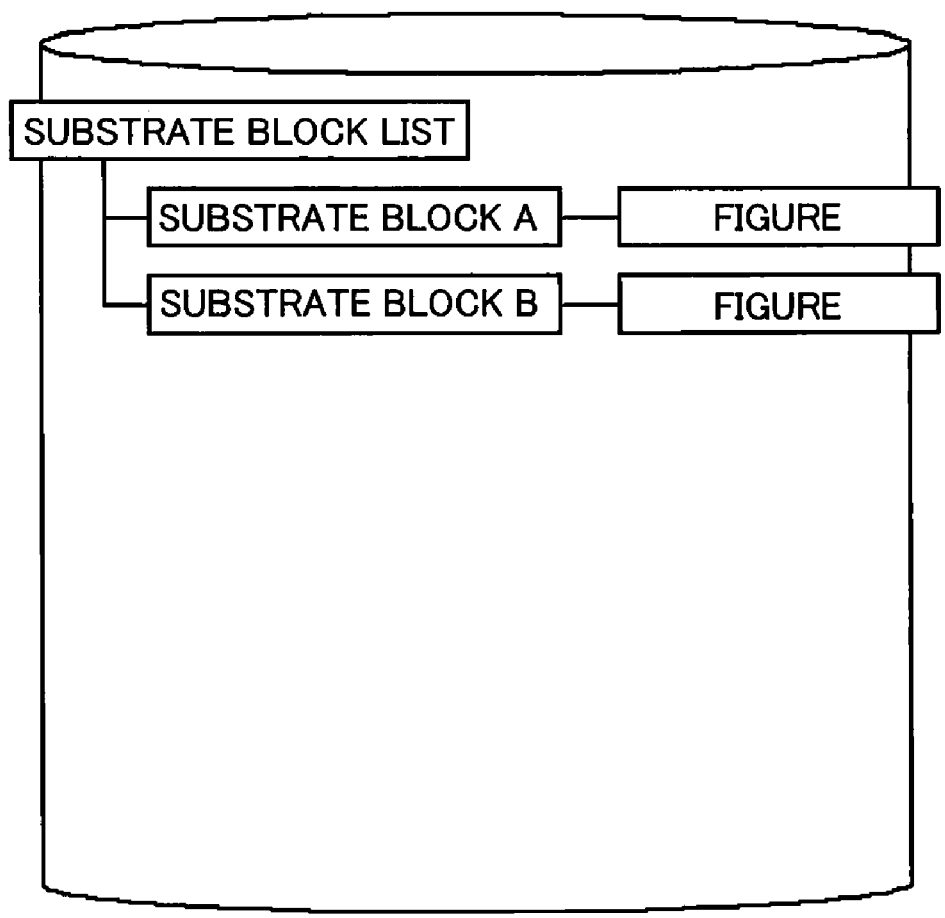
FIG. 4 is a conceptual explanatory view showing a data structure inside a database that is built after the substrate block is inputted.

Specifically, in this embodiment, as shown in FIG. 4, a substrate block list is created in the database as the list corresponding to the objects, the substrate block A and the substrate block B are stored in the created substrate block list, and furthermore, figure expressing each substrate block is stored to the substrate block A and the substrate block B and allowed to associated with each other.

Herein, in the electric information processing unit 10, as a figure selectable as the figure expressing each substrate block on the screen of the display unit 18, a symbolic figure displaying theoretical contents, a two-dimensional actual size figure displaying the contents of two-dimensional mounting and a three-dimensional actual size figure displaying the contents of three-dimensional mounting are set, and the two-dimensional actual size figure is used as the figure of a substrate block in this embodiment.

When the processing of step S202 ends, procedure advances to the processing of step S204, input of signal information being electric information to the object is made possible by the user's input of a signal input command using the pointing device 20 or the character input device 22, and the input is performed.

In this embodiment, in response to the input of a signal input command, specifically, it is assumed that the signal information being electric information is inputted to the substrate block A that was created by the substrate block input processing of step S202 on the screen of the display unit 18. More specifically, when the user selects the substrate block A displayed on the display unit 18 by the pointing device 20 such as a mouse after the input of the signal input command, a signal list 18*a* to which a signal name and a signal type regarding the substrate block A can be inputted is displayed on the display unit 18. Then, the user inputs the signal name and the signal type of a signal that is inputted/outputted to/from the substrate block A (either one of "power source", "GND" (ground: ground)) and "Normal" (general signal) can be set as a signal type) on the signal list 18*a* by using the character input device 22.

Figure 3B:
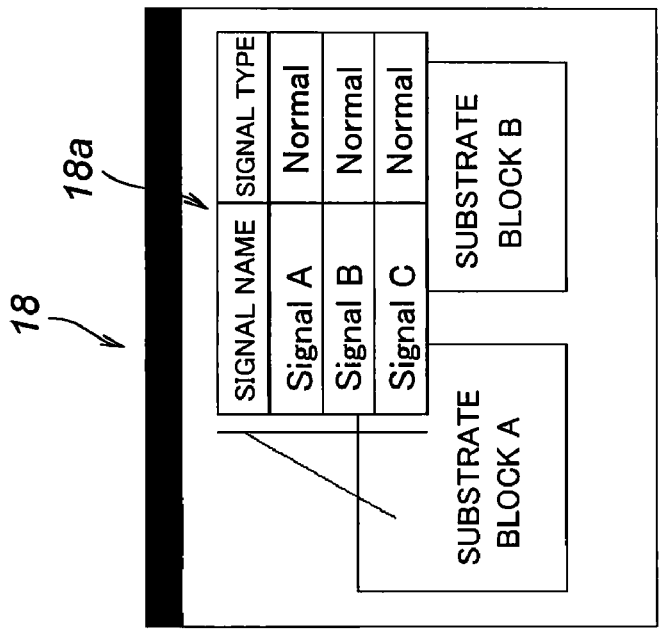
FIG. 3(b) is a display example displayed on the screen of the display unit when inputting signal information.
Figure 3A:
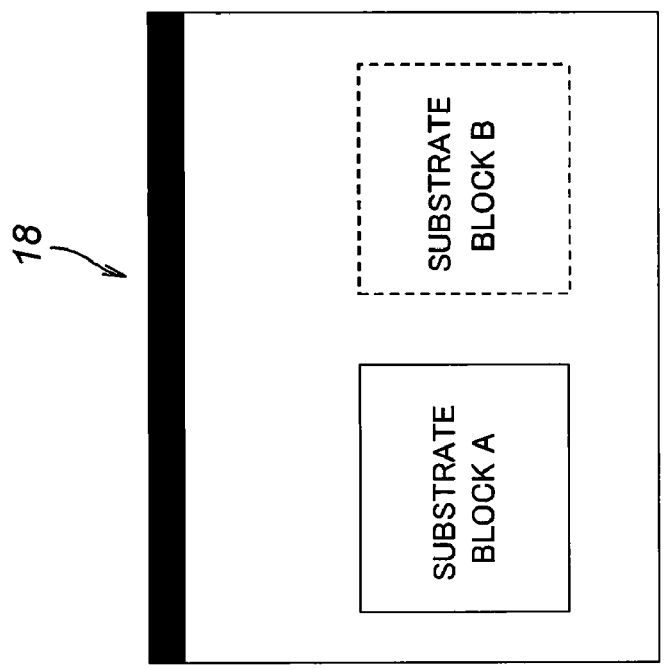
FIG. 3(a) is a display example that is displayed on the screen of a display unit after a substrate block is inputted.

In the example shown in FIG. 3(*b*), "Signal A", "Signal B" and "Signal C" are inputted as the signal name, and "Normal" is inputted as the signal type to all of Signal A, Signal B and Signal C.

Figure 5:
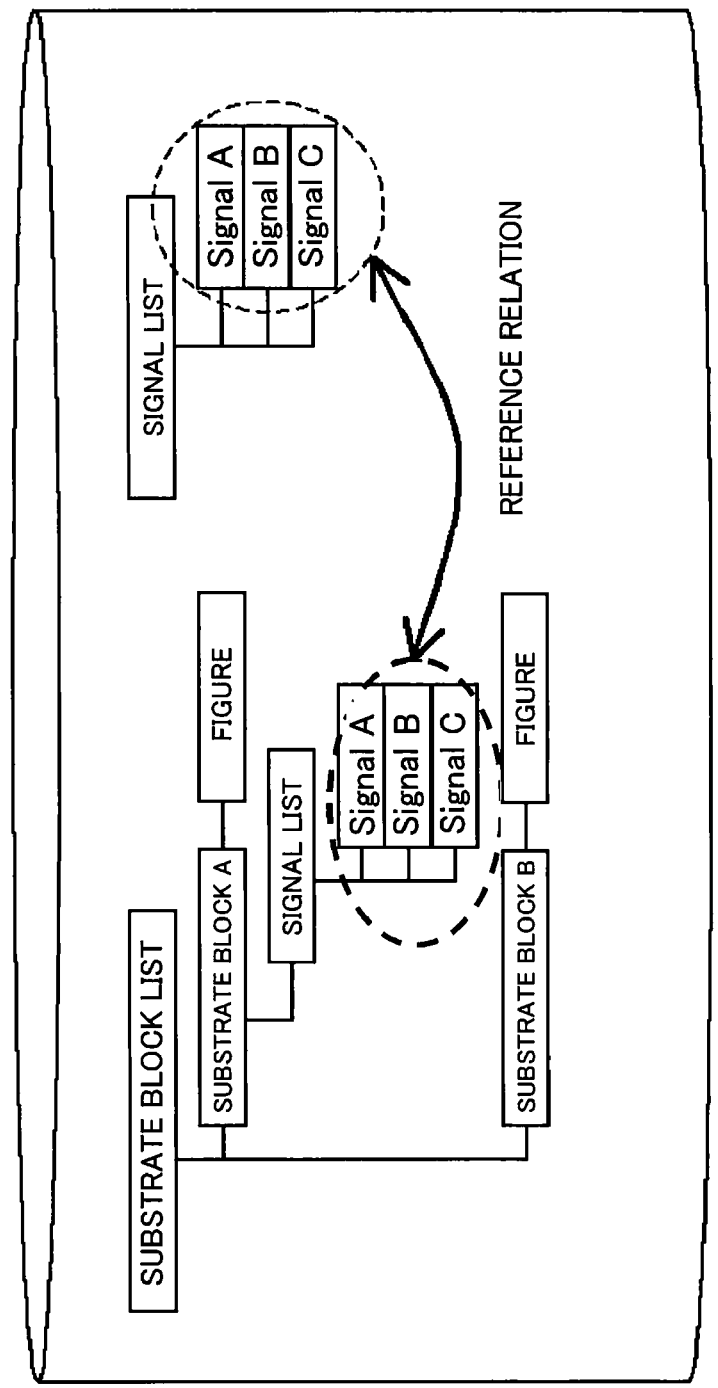
FIG. 5 is a conceptual explanatory view showing a data structure inside a database that is built after signal information is inputted.

Then, corresponding to the signal input, the signal list is created in the database inside the storage 16 by the control of the CPU 12, the inputted signal is stored in the signal list in the database, and the signal is stored and allocated on the signal list in a substrate block list. Specifically, in this embodiment, as shown in FIG. 5, the signal list is created in the database corresponding to the input of signal information on the display unit 18, and the signal name inputted on the display unit 18 is stored on the signal list in the database. Furthermore, a signal list same as the above-described created signal list is also created in the substrate block A on the substrate block list, the signal list created in the database and the signal list in the substrate block list are associated with each other in a reference relation and stored in the storage 16.

Herein, in this specification, "associated in a reference relation" means that the both lists in reference relation have information of the same contents by a processing of storing information of an associating factor in information to be associated with each other. Therefore, if one information is changed, the other information corresponding to this one information before change can be also changed so as to match one changed information.

When the processing of step S204 ends, procedure advances to the processing of step S206, using the pointing device 20 or the character input device 22 by the user's input of a circuit input command, input of circuit data to the object is made possible and the input is performed. Herein, the circuit data is design information that theoretically expresses the electrical operation of product, and it is built by having electric information such as a circuit part, an electric signal and a circuit block. In this embodiment, specifically, a window 18*b* in which the circuit data exists is displayed on the display unit 18, desired circuit data is selected from the circuit data displayed on the window 18*b*, and it is inputted to the substrate block B by dragging and dropping by using the pointing device 20 such as a mouse (refer to FIG. 6(*a*)).

Figure 6:
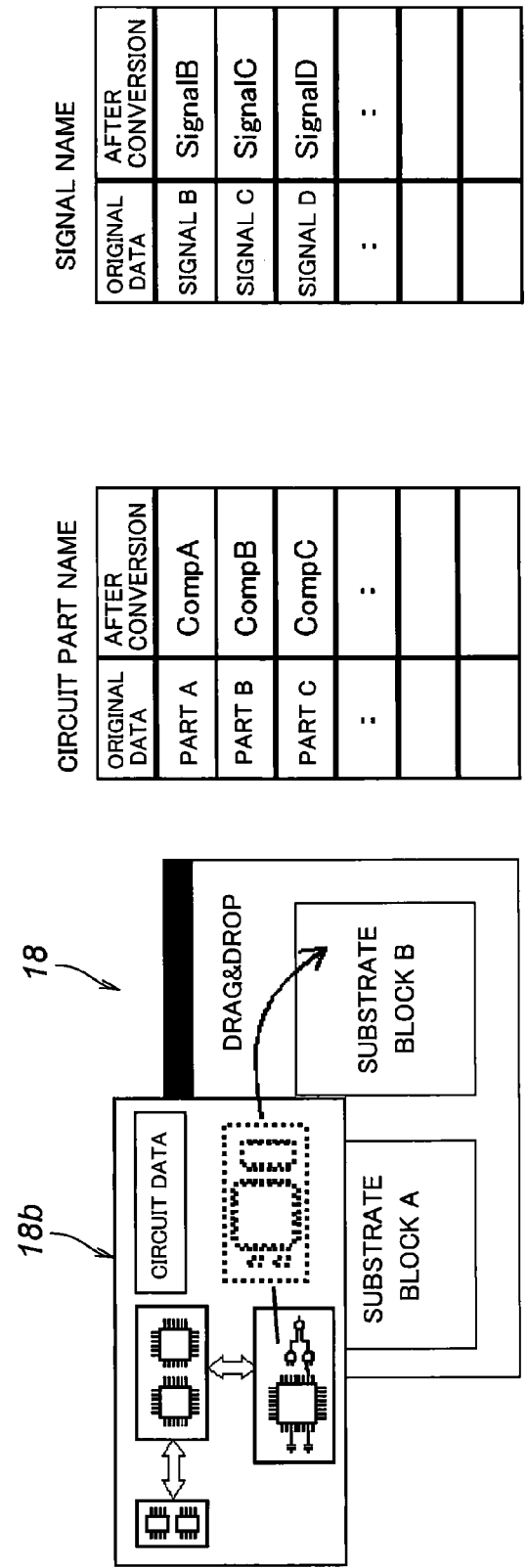
FIG. 6(a) is a display example that is displayed on the screen of a display unit when inputting circuit data.
FIG. 6(b) is a display example that is displayed on the screen of a display unit in changing circuit part name when inputting circuit data.
FIG. 6(c) is a display example that is displayed on the screen of the display unit in changing signal name when inputting circuit data.

Then, the user designates circuit part information or electric information in the circuit data, which was inputted to the substrate block as described above, desired circuit part information or electric information is inputted instead of the designated circuit part information or electric information, and the designated information can be converted into the inputted information. More specifically, by taking out the circuit data information or electric information in the inputted circuit part, performing an input operation by the user while using the character input device 22 such as a keyboard, the circuit part name and signal name can be newly set. FIG. 6(*b*) shows the relation between the original data and data after conversion of the circuit part name, and FIG. 6(*c*) shows the relation between the original data and data after conversion of the signal name.

Figure 7:
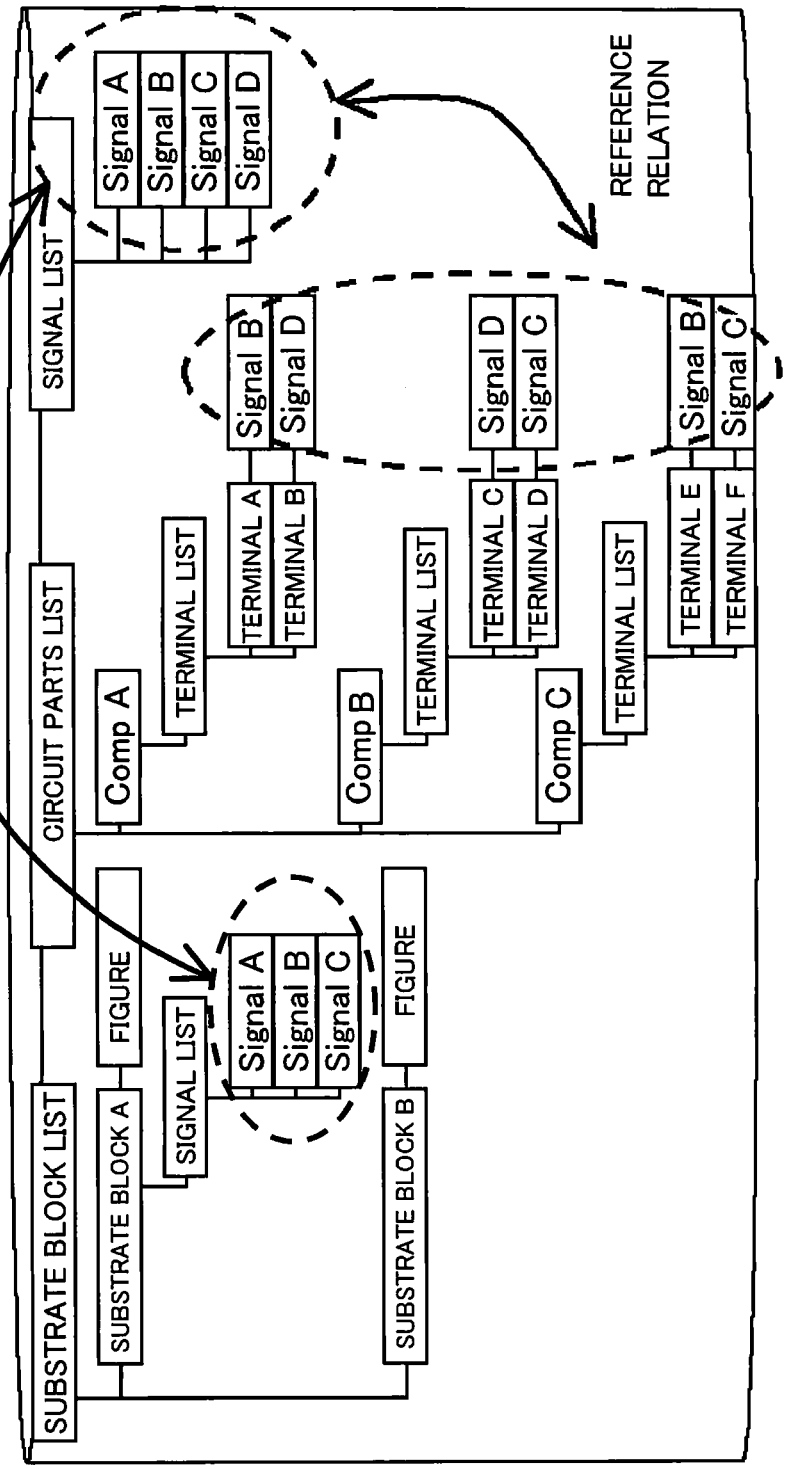
FIG. 7 is a conceptual explanatory view showing a data structure inside the database that is built after the circuit data is inputted.

Then, corresponding to the circuit input, the circuit parts and the signal are stored on the database by the control of the CPU 12, and which signal is allocated for which terminal of the circuit part is also stored. In this embodiment, specifically, the circuit parts list is created on the database as shown in FIG. 7, and CompA, CompB and CompC are stored on the created circuit parts list reflecting the newly set circuit part names.

Then, since terminals are severally allocated for CompA, CompB and CompC, a terminal list is severally created for CompA, CompB and CompC by the control of the CPU 12, and each terminal is stored on each terminal list.

Furthermore, since signals are associated with terminals A to F, which are allocated and stored on the terminal list, each signal corresponding to each terminal is stored by the control of the CPU 12.

More specifically, the terminals A to F are severally allocated for the circuit parts in the circuit data, and either one of the signals SignalB, C and D is associated with the terminals A to F.

More particularly, due to the fact that the signals SignalB, SignalC and SignalD, which the terminals of circuit parts installed to the substrate block B have were inputted, by the processing of inputting signal information by the circuit data on step S206, SignalD is newly allocated in addition to SignalA, SignalB and SignalC, which already exist on the signal list, on the signal list in the database.

In this embodiment, additional information should be judged by matching of names, and in the setting of signal names when inputting signal information utilizing the circuit information of the substrate block B on the display unit 18, names corresponding to the signal on the signal list should be set.

Further, signals allocated for the terminals in the circuit parts list, signals on the signal list and a signal list under the hierarchy of the substrate block list are associated with each other on the assumption that they are in reference relation.

By this association, matching of signal information between the circuit data and the substrate block is held.

Figure 8:
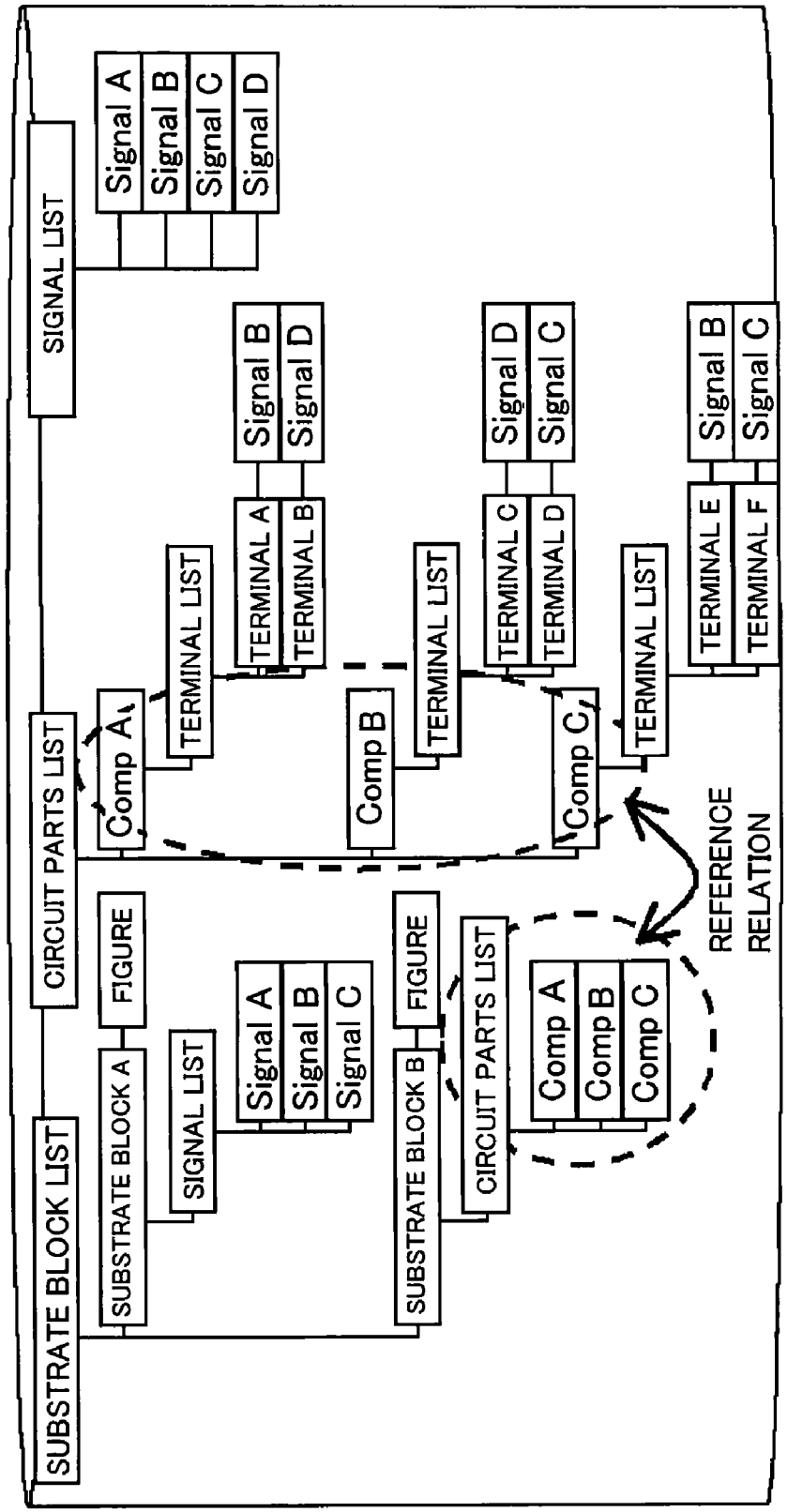
FIG. 8 is a conceptual explanatory view showing a data structure inside the database that is built after a circuit part name is allocated for a substrate block.

Furthermore, corresponding to the circuit input, circuit part names are allocated for the substrate block and stored on the database by the control of the CPU 12. Specifically, as shown in FIG. 8, a circuit parts list is created for the substrate block B in the database, and CompA, CompB and CompC are allocated for the circuit parts list and stored. CompA, CompB and CompC of the circuit parts list are associated with CompA, CompB and CompC on the circuit parts list in the substrate block B as reference relation.

By this association, matching between circuit data, substrate block and circuit parts is held.

When the processing of step S206 ends, procedure advances to the processing of step S208, and a display processing of rats is performed by the user's input of a rats display command using the pointing device 20 or the character input device 22.

Figure 9:
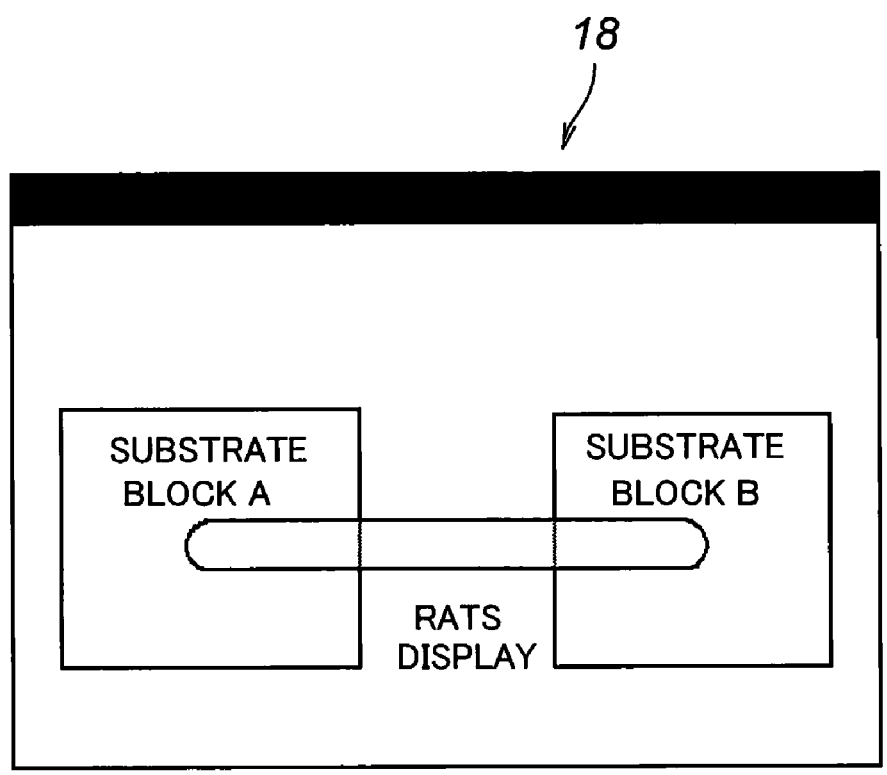
FIG. 9 is a display example that is displayed on the screen of the display unit in a rats display processing between two substrates.

As the display processing of rats, in this embodiment, signals that belong to each substrate block are listed by the control of the CPU 12, specifically, and in the case where the same ones exist, rats showing electrical linkage between substrate blocks of the substrate block A and the substrate block B are displayed as shown in FIG. 9.

Figure 10:
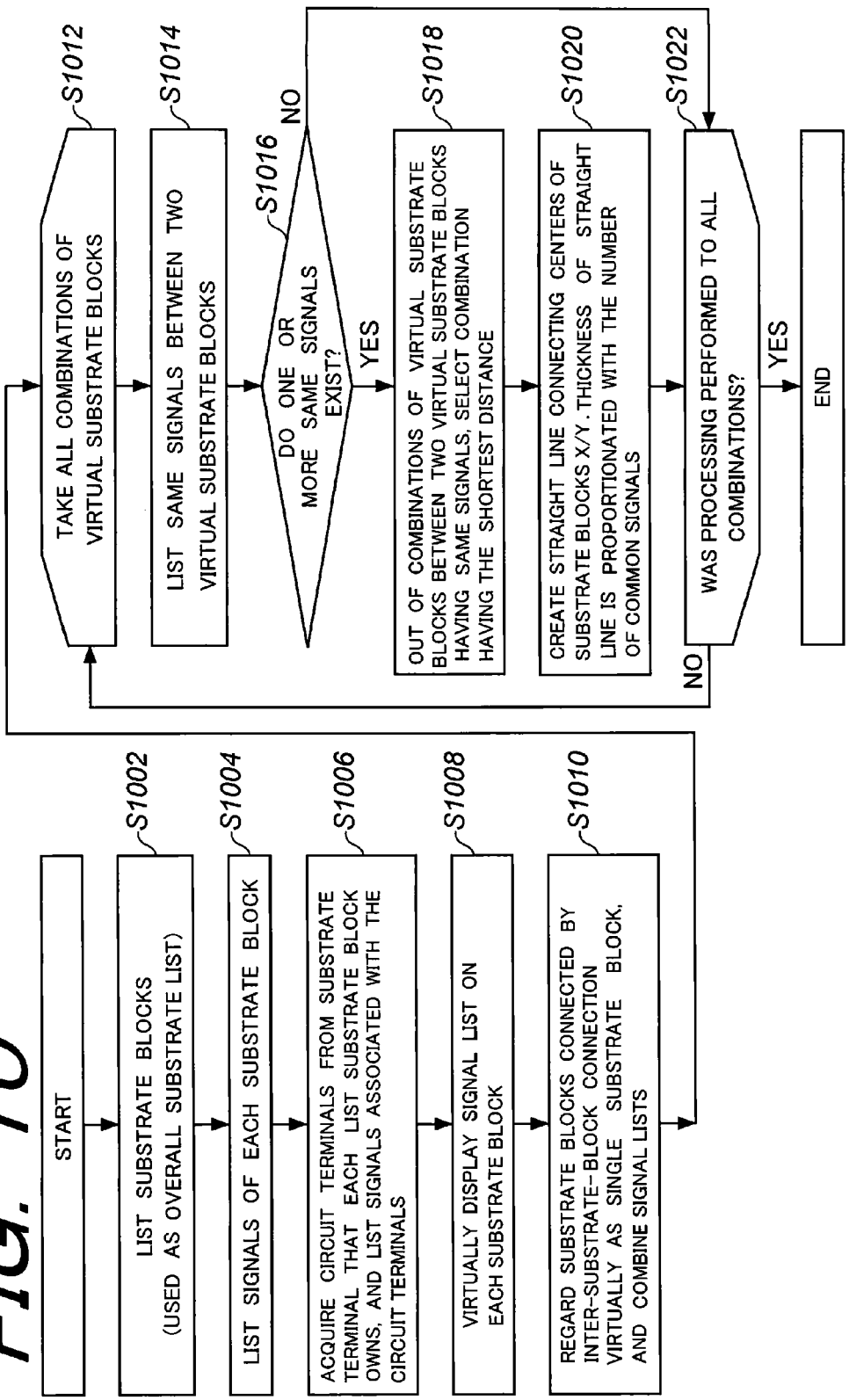
FIG. 10 is a flowchart showing the processing routine of the rats display processing according to the present invention.

Herein, this embodiment explains the display of rats between two substrate blocks of the substrate block A and the substrate block B, and for easier understanding of this display processing of rats, description will be made for the display of rats between four substrate blocks the substrate blocks A to D referring to the flowchart shown in FIG. 10 and the conceptual explanatory view of display processing of rats between substrate blocks shown in FIGS. 11(a)(b) and FIG. 12.

More specifically, in the display processing of rats executed by this control of the CPU 12, all substrate blocks displayed on the display unit 18 are listed first, and an overall substrate list is created (step S1002).

Next, signals owned by each substrate block are listed by each substrate block (step S1004).

Then, circuit terminals are acquired from the substrate terminals owned by each substrate block, and signals associated with the circuit terminals are listed by each substrate block (step S1006).

Next, as shown in FIG. 11(a), the signal list listed by the processing of step S1004 is virtually displayed on each substrate block that was displayed on the screen of the display unit 18 (step S1008). It is to be noted that "virtually displayed" means a state different from normal display on the screen, that is, display in which concentration or color is changed in making display, for example, and means a display mode that is not decisive regular display state.

Then, in substrate blocks linked by the inter-substrate-block connection such as the substrate block B and substrate block D, signal lists are combined virtually as a single substrate block and virtual substrate blocks are severally created as shown in FIG. 11(b) (step S1010). More specifically, the virtual substrate block means a plurality of substrates, in which signal lists are synthesized as the single substrate block, are put together.

Meanwhile, details of the inter-substrate-block connection will be described later, but the setting of inter-substrate-block connection can be arbitrarily changed by appropriately performing a processing to be described later.

Next, between virtual substrate blocks that were created on step S1010, all combinations connecting between two arbitrary virtual substrate blocks are confirmed (step S1012).

Between two virtual substrate blocks in each combination, the same signals displayed on virtual substrate blocks are listed (step S1014), and whether or not the same signal exist is judged (step S1016).

Then, in the case of judgment that one or more of the same signals exist in the judgment processing of the step S1016, combination having the closest arrangement distance between virtual substrate blocks out of combinations between virtual substrate blocks having the same signal name is selected (step S1018).

Next, a straight line (rats) connecting the center points of virtual substrate blocks, which were selected on step S1018, is created, and it is displayed (step S1020). At this point, the rats to be displayed is created such that thickness is changed in proportion to the common number of signals. More specifically, the rats to be displayed is made thicker as the number of common signals becomes larger.

Specifically, in the virtual substrate block shown in FIG. 11(b), when attention is paid to a virtual substrate A and a virtual substrate B, SignalB exists between the two virtual substrate blocks as the same signal.

Similarly, when attention is paid to the virtual substrate block B and a virtual substrate block C, SignalC, SignalD and SignalE exist as the same signals between the two virtual substrate blocks.

Furthermore, when attention is paid to the virtual substrate block A and the virtual substrate block C, the same signal does not exist between the two virtual substrate blocks.

As described, substrate blocks to which inter-substrate-block connection was performed share signals virtually as the same substrate block, confirm the existence of the same signals with another substrate block.

Figure 12:
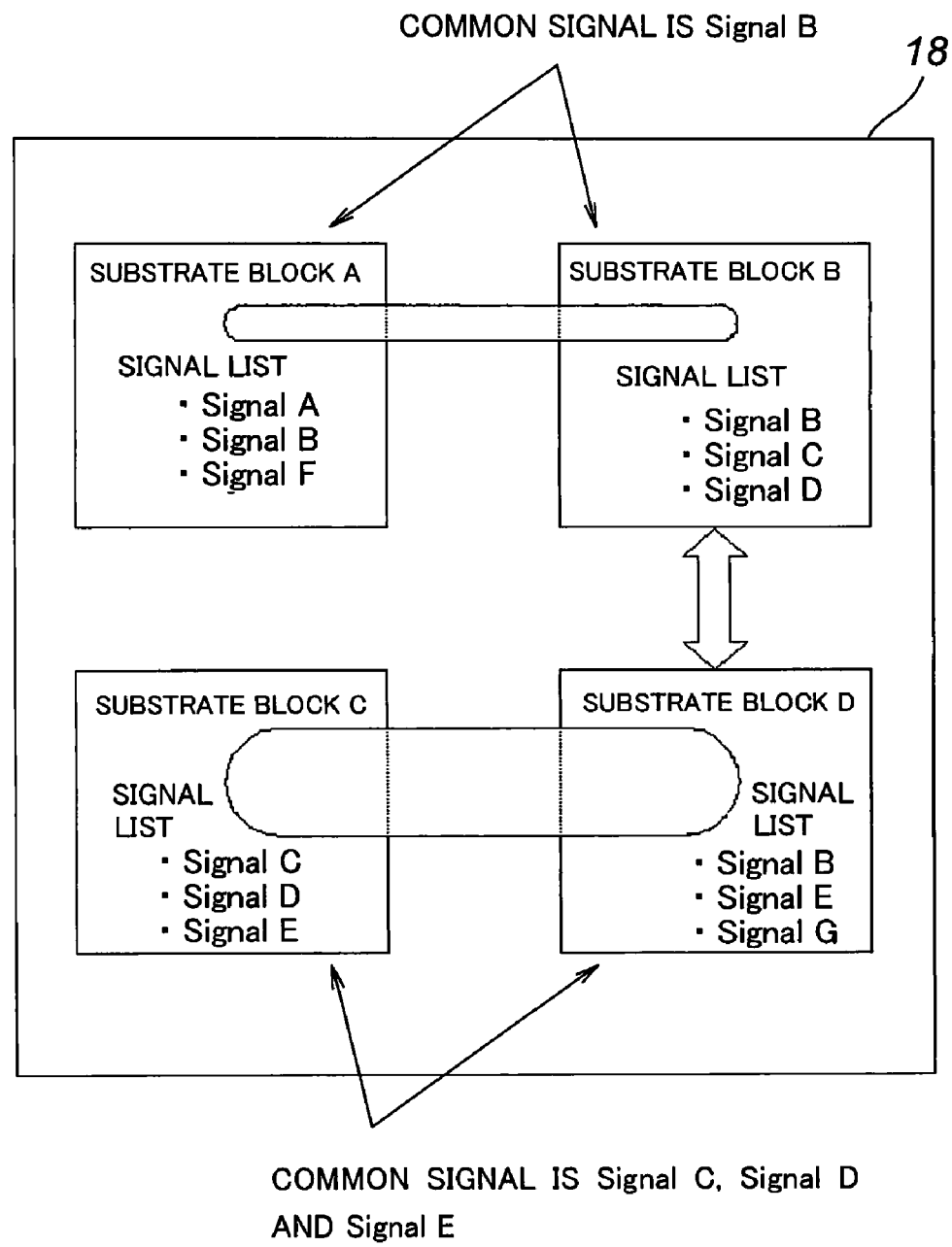
FIG. 12 is a display example of rats between substrate blocks, which is displayed by the rats display processing according to the present invention.

Then, in the case of actually displaying rats, rats is displayed between the substrate block A and the substrate block B by a single common signal of SignalB as shown in FIG. 12. On the other hand, rats are displayed by the three common signals of SignalC, SignalD and SignalE between the substrate block C and a substrate block D.

At this point, signal information between the substrate block A and the substrate block B is one whereas signal information between the substrate block C and the substrate block D is three, so that the thickness of rats to be displayed between the substrate block C and the substrate block D is thicker than the one between the substrate block A and the substrate block B.

It is to be noted that only SignalB, SignalE and SignalG are shown on the signal list of the substrate block D, it is regarded that SignalB, C, D, E and G exist in the substrate block D (which falls under virtual substrate B) because it is connected to the substrate block B.

For this reason, common signal information between the substrate block C and the substrate block D is three that are SignalC, SignalD and SignalE.

Further, although SignalB in the substrate block A exists in the substrate block B and the substrate block D, rats is displayed between the substrate block B and the substrate block A having a closer arrangement distance between substrate blocks by the processing of step S1018, and indication that they should be electrically connected is made.

Similarly, rats is displayed between the substrate block C and the substrate block D having a closer arrangement distance.

More specifically, in the case where substrate blocks connected by the inter-substrate-block connection exist, confirming the existence of the same signal is judged by signal lists displayed on virtual substrate blocks in the display of rats between substrate blocks, rats are displayed from each substrate block in actually displaying rats.

When processing of the step S1020 ends, procedure advances to the processing of the next step S1022.

On the other hand, in the case of judgment that the same signal does not exist in the judgment of the step S1016, procedure advances to the processing of step S1022 without displaying rats (refer to the relation between the virtual substrate A and the virtual substrate C of FIG. 11(b)).

In the processing of step S1022, whether or not processing was performed to all combinations of virtual substrate blocks is judged, and if there is a combination to which processing was not performed, procedure returns to step S1012 and processing is repeated, the rats display processing of step S208 is ended when processing ends to all combinations.

Figure 13:
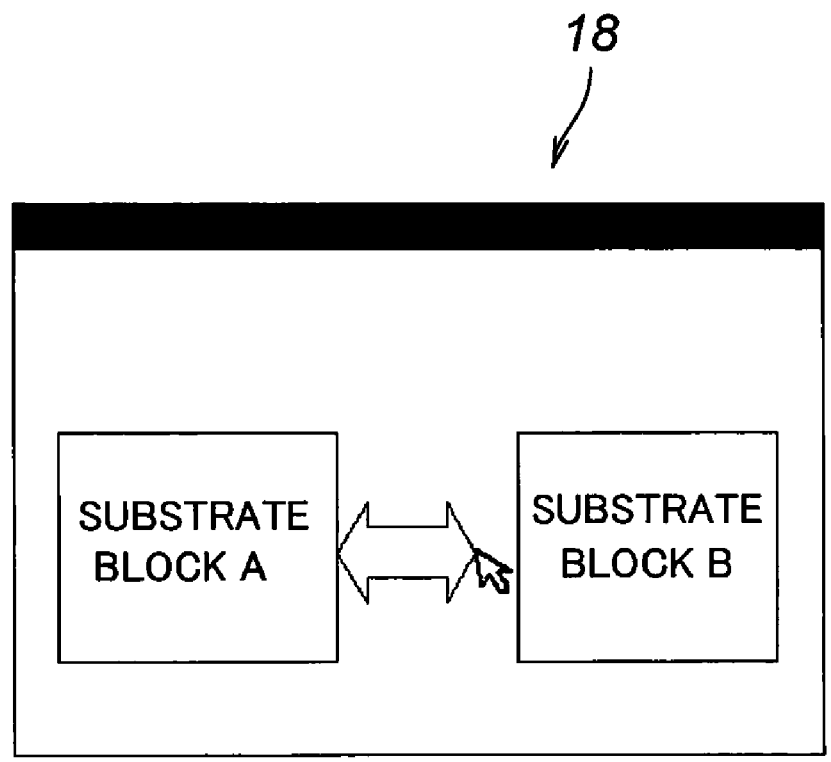
FIG. 13 is a display example that is displayed on the screen of the display unit in creating inter-substrate-block connection by the present invention.

When the processing of step S208 ends as described the above, procedure advances to the processing of step S210, the processing of inter-substrate connection in which desired substrate blocks are connected is performed by the user's input of an inter-substrate connection input command by using the pointing device 20 or the character input device 22. In this embodiment, specifically, by continuously clicking arbitrary points of each substrate block, which were associated by rats display, on the display unit 18 by the pointing device 20 such as a mouse, a figure such as an arrow and a polyline is inputted between substrate blocks (refer to FIG. 13).

Figure 14:
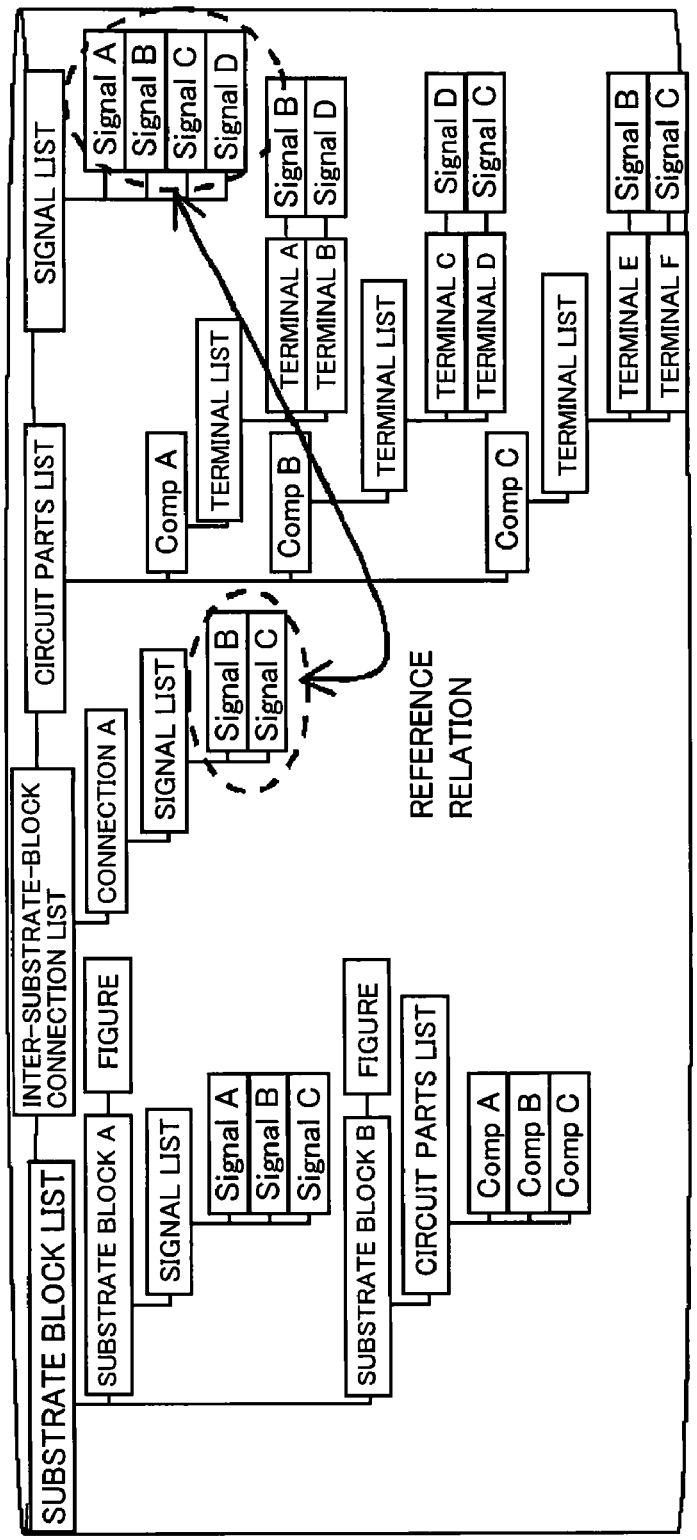
FIG. 14 is a conceptual explanatory view showing a data structure inside the database, which is built after creating inter-substrate-block connection by the present invention.

Then, corresponding to the above-described input of the inter-substrate connection, inter-substrate-block connection list is created in the database by the control of the CPU 12, and a connection being the inter-substrate-block connection ("connection A" in FIG. 14) is allocated as an inputted figure (refer to FIG. 14). More specifically, the inter-substrate-block connection is built on the database, and a common signal between substrate blocks is associated with the connection.

Furthermore, a signal list being the electric information between substrate blocks, which was confirmed in making rats display, is allocated for the connection ("connection A" in FIG. 14), and the signal list in the inter-substrate-block connection list is associated with the signal list in the database as reference relation (refer to FIG. 14).

Figure 15:
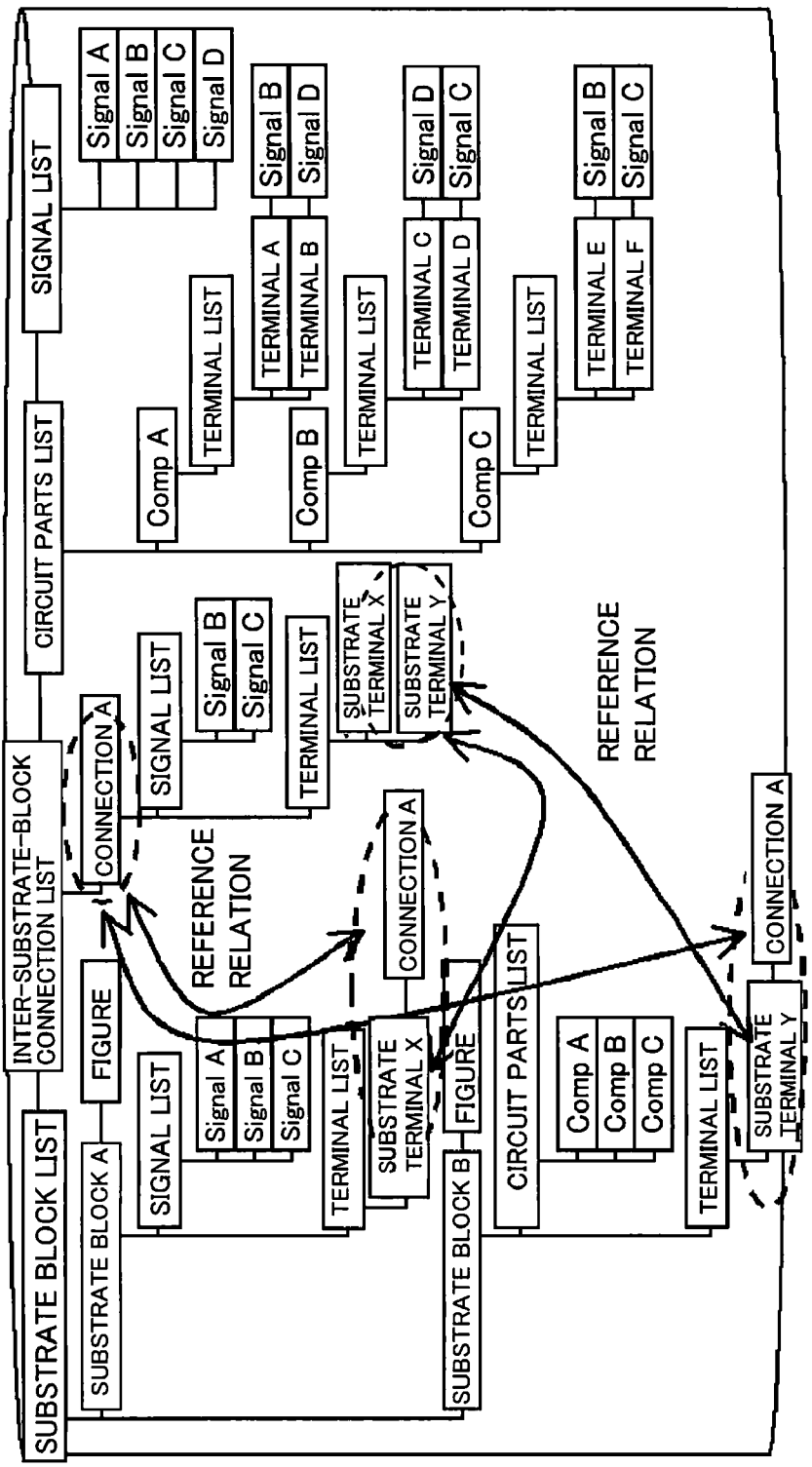
FIG. 15 is a conceptual explanatory view showing a data structure inside the database, which is built after creating inter-substrate-block connection by the present invention.

Further, on the database, terminals are built on each substrate block by the control of the CPU 12 as in FIG. 15, and inter-substrate-block connection is associated. In this embodiment, specifically, since the connection A being the inter-substrate-block connection connects the substrate block A with the substrate block B, terminal lists are installed in the connection A being the inter-substrate-block connection and the substrate blocks (A,B) in the substrate block list, a substrate terminal X in the substrate block A and a substrate terminal Y in the substrate block B are allocated for the terminal list of the connection A being the inter-substrate-block connection (refer to FIG. 15).

Further, the connection A is associated with the substrate terminals (X,Y) that are installed to the substrate blocks (A,B), the substrate terminals (X,Y) in the substrate block list is associated with the substrate terminals (X,Y) in the inter-substrate-block connection list as reference relation, and furthermore, the connection A that is associated with substrate terminals in the substrate block list is associated with the connection A in the inter-substrate-block connection list as reference relation (refer to FIG. 15).

Next, procedure advances to the processing of step S212, and condition setting for making physical connection is executed. More specifically, by the connection processing between substrate blocks of step S210, a condition of connection between the substrate blocks (A,B) and the substrate terminals (X,Y) that are provided for the connection A being the inter-substrate-block connection is set.

Figure 16B:
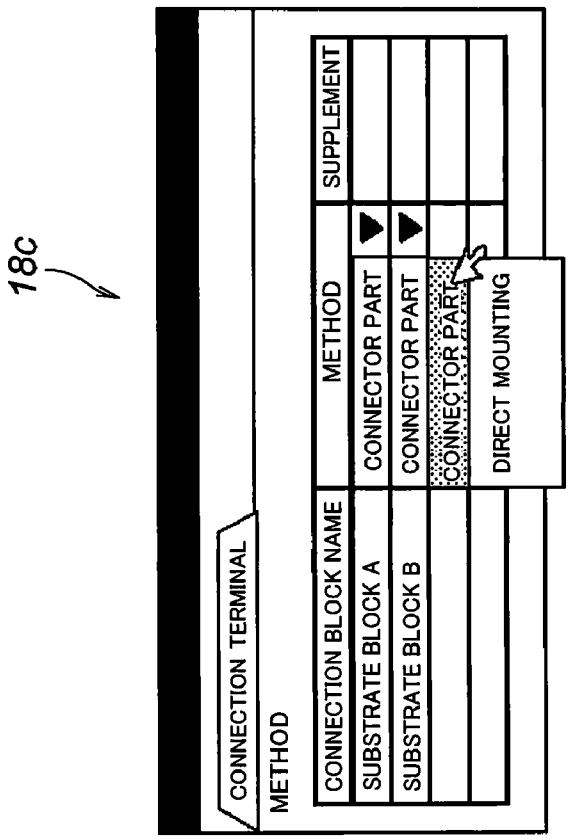
FIG. 16(b) is a display example of a connection terminal window that is displayed on the display unit.
Figure 16A:
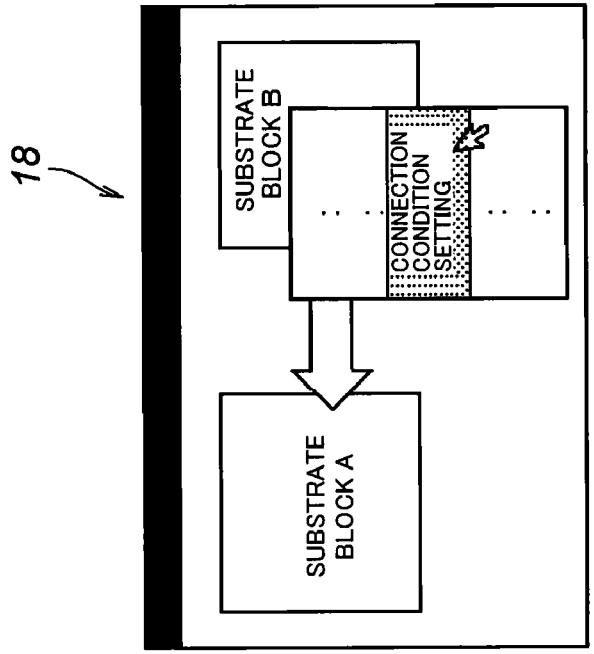
FIG. 16(a) is a display example of connection condition setting of substrate blocks to which inter-substrate-block connection was performed by the present invention.

In this embodiment, specifically, when a property is opened by the right click of the pointing device 20 such as a mouse on the display unit 18 and a connection condition setting command is selected, for example, (refer to FIG. 16(a)), a window 18c of connection terminals is displayed (refer to FIG. 16(b)).

Then, a connection method in the substrate terminals (X,Y), which were installed in the connection processing between substrate blocks on step S210, is selected.

More particularly, as shown in FIG. 16(b), on the window of connection terminals, whether terminals are connected by using a connector part or directly mounted is selected to the substrate block A and the substrate block B, in the column of method. It is to be noted that the connection method by using a connector part is selected in this embodiment.

Figure 17:
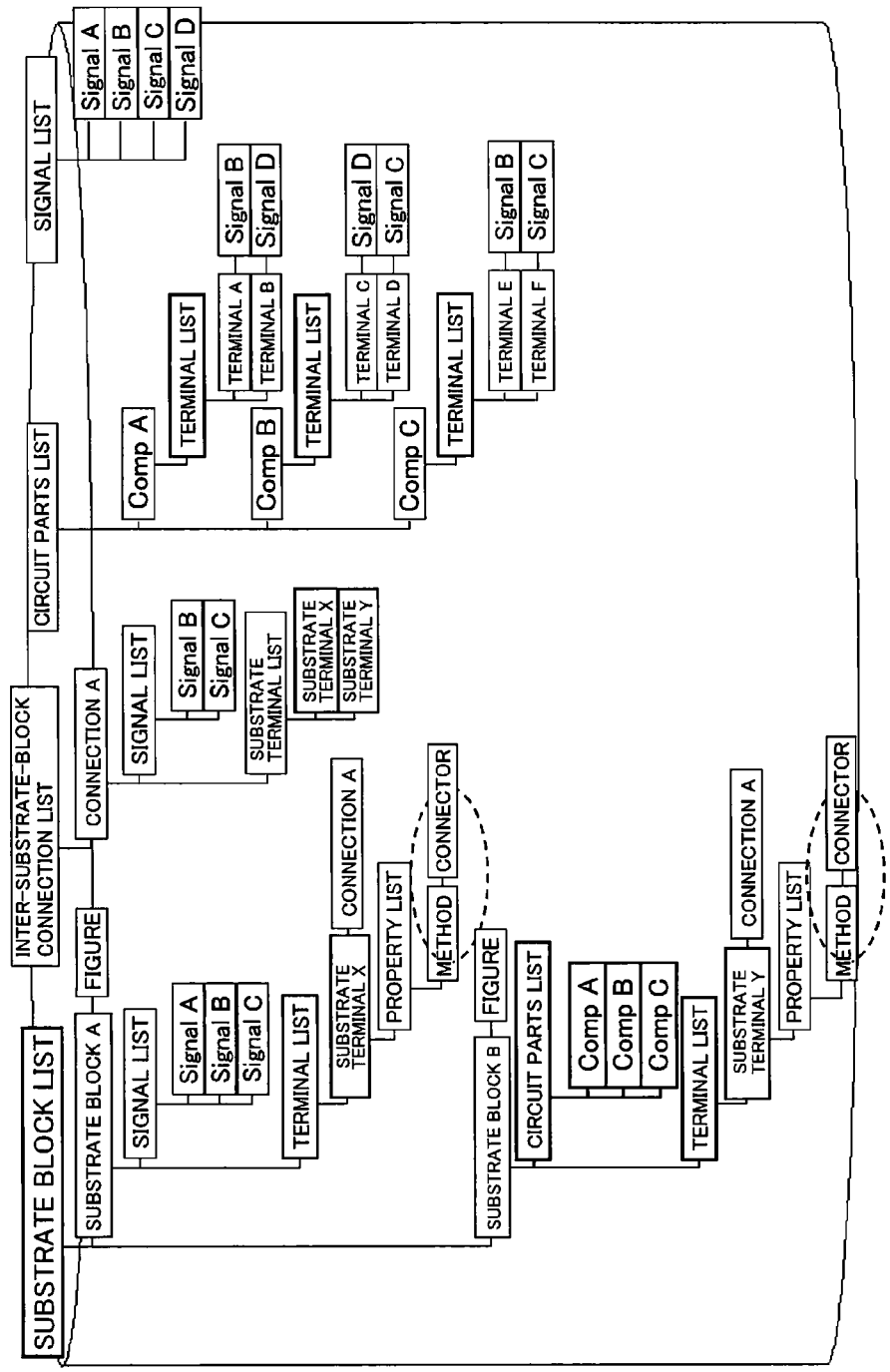
FIG. 17 is a conceptual explanatory view showing a data structure inside the database, which is built after a connection condition setting processing.

Corresponding to the input of connection condition setting on the display unit 18, the connection method that was set in the connection terminal window on the display unit 18 is associated as the property information of the substrate terminals (X,Y) and saved in the database by the control of the CPU 12 (refer to FIG. 17).

More specifically, the property list is severally allocated for the substrate terminals (X,Y), which are installed to the substrate blocks (A,B) in the substrate block list, and connector is set as a method (refer to the area surrounded by dashed line of FIG. 17).

When the processing of step S212 ends as described above, procedure advances to the processing of step S214, a processing of generating connecting part is performed according to the connection condition setting on step S212 by the user's input of a connecting part generation command by using the pointing device 20 or the character input device 22. More specifically, the inter-substrate-block connection is selected, and parts are generated on each substrate block by referring to the connection method.

In this embodiment, parts to be connected to the connection A being the inter-substrate-block connection are generated on each substrate block by this processing, and terminals are installed to the parts, and furthermore, signals are associated with the installed terminals.

Figure 18:
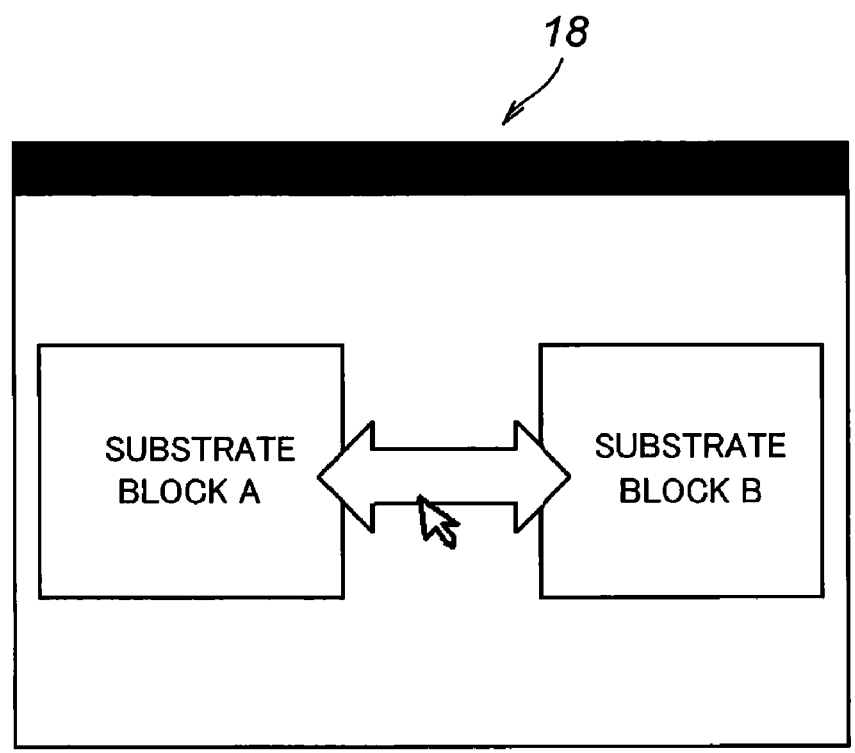
FIG. 18 is a display example that is displayed on the screen of the display unit in the connection part generating processing according to the present invention.

Specifically, the connection A being the inter-substrate-block connection is selected on the screen of the display unit 18 (refer to FIG. 18), and parts are installed to each substrate block according to the condition (connection method of each substrate block) that was set in the connection condition setting processing of step S212.

Further, in moving on the design of signals connected to the connection A being the inter-substrate-block connection, specific information cannot be considered unless the substrate terminals (X, Y) are connected to the terminals A to F of the circuit parts CompA to C.

Figure 19:
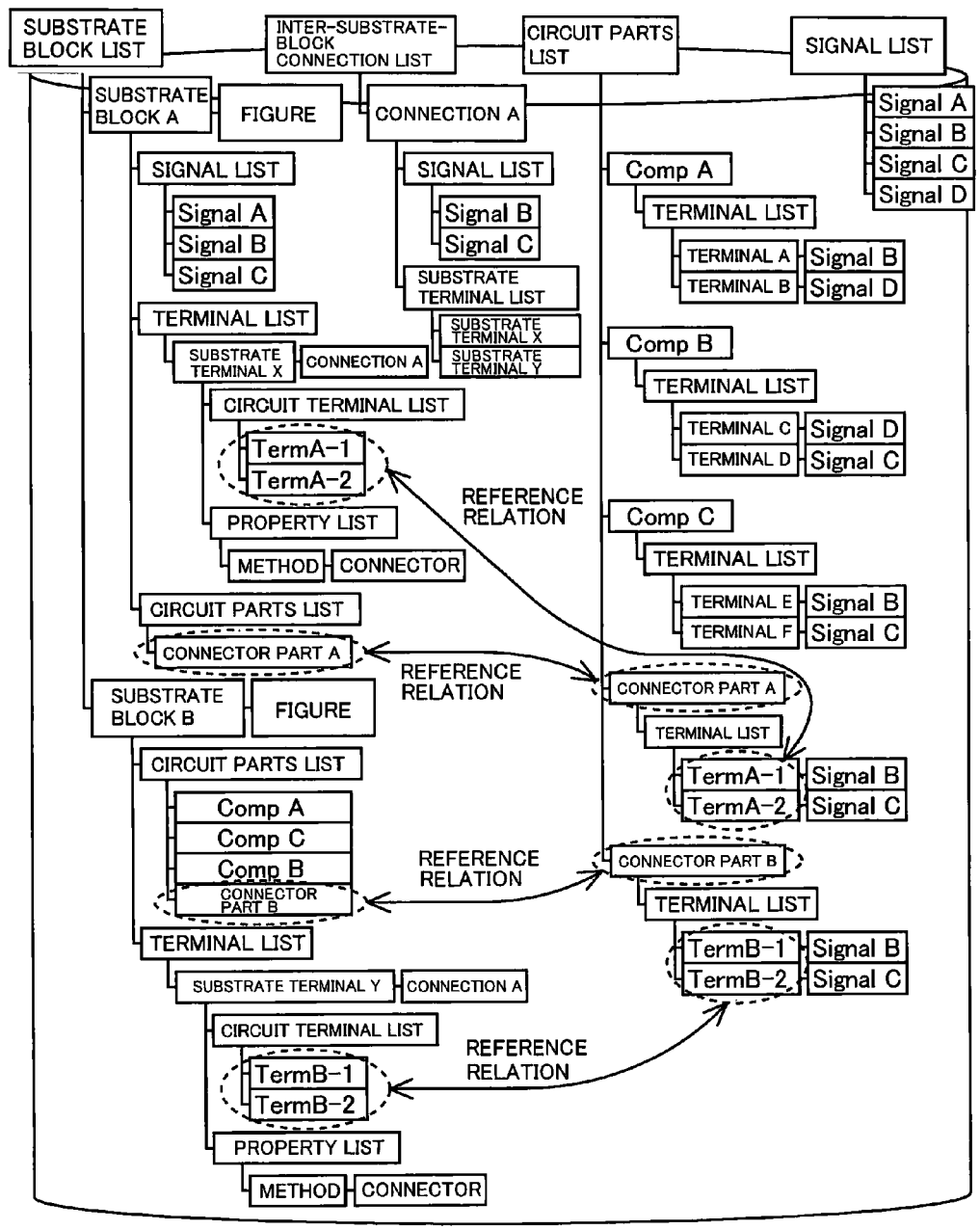
FIG. 19 is a conceptual explanatory view showing a data structure inside the database, which is built after the connecting part generating processing according to the present invention.

Then, corresponding to part generation on the display unit 18, substrate terminals are associated with the terminals of circuit parts by the control of the CPU to enable specific consideration in the database (refer to FIG. 19).

Specifically, a processing below is performed in the database.
(1) Generating connector parts
(2) Building terminals of connector parts equivalent to the number of signals of inter-substrate-block connection
(3) Allocating signals of inter-substrate-block connection for the built terminals in order
(4) Associating terminals of the inter-substrate-block connection with the terminals of connector parts
(5) Associating each substrate block with connector parts Herein, description will be made in detail for the processing of associating the terminals of the inter-substrate-block connection with the terminals of connector parts in (4) above.

Figure 20A:
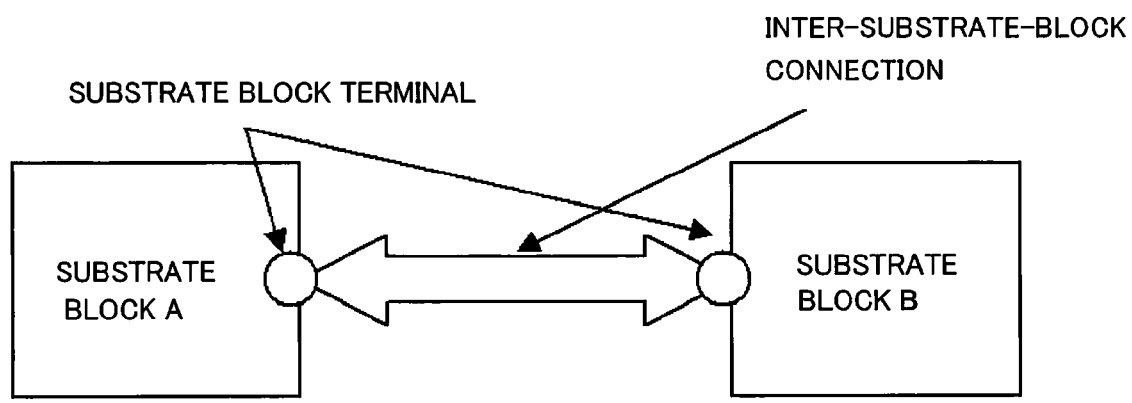
FIGS. 20(a)(b) are explanatory views of the connecting part generating processing according to the present invention.
Figure 20B:
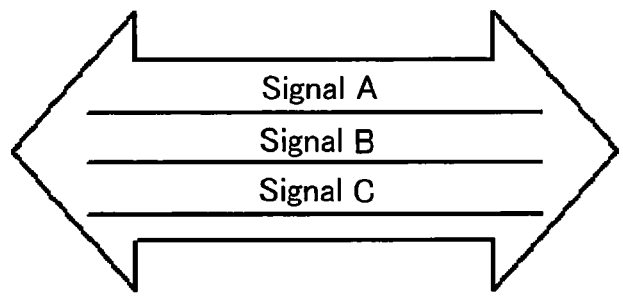

First of all, it is assumed that the connection relation shown in FIG. 20(*a*) be previously inputted by using substrate blocks, substrate block terminals and inter-substrate-block connection.

Further, it is assumed that a plurality of signals, more specifically, SignalA, Signal B and Signal C be allocated for the inter-substrate-block connection as shown in FIG. 20(*b*).

Figure 21:
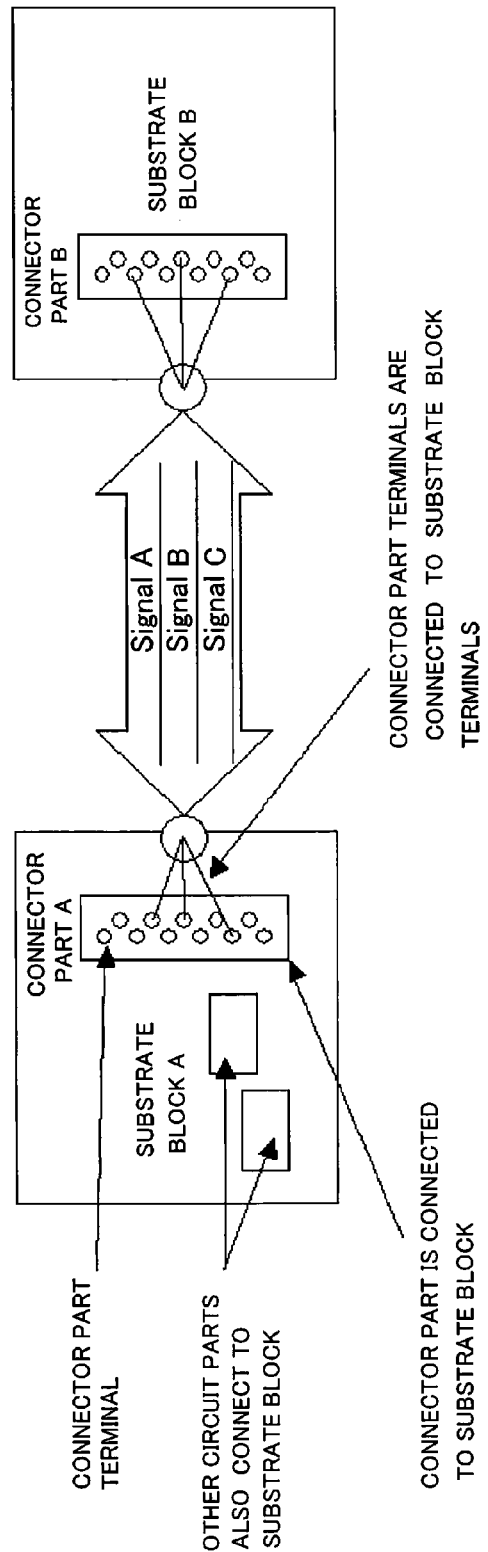
FIG. 21 is an explanatory view of the connecting part generating processing according to the present invention.

In moving on the design of signals connected to the inter-substrate-block connection, specific information cannot be considered unless substrate block terminals are connected to the terminals of circuit parts. Then, as shown in FIG. 21, substrate block terminals are associated with the terminals of circuit parts to realize environment in which specific consideration can be done.

Figure 22:
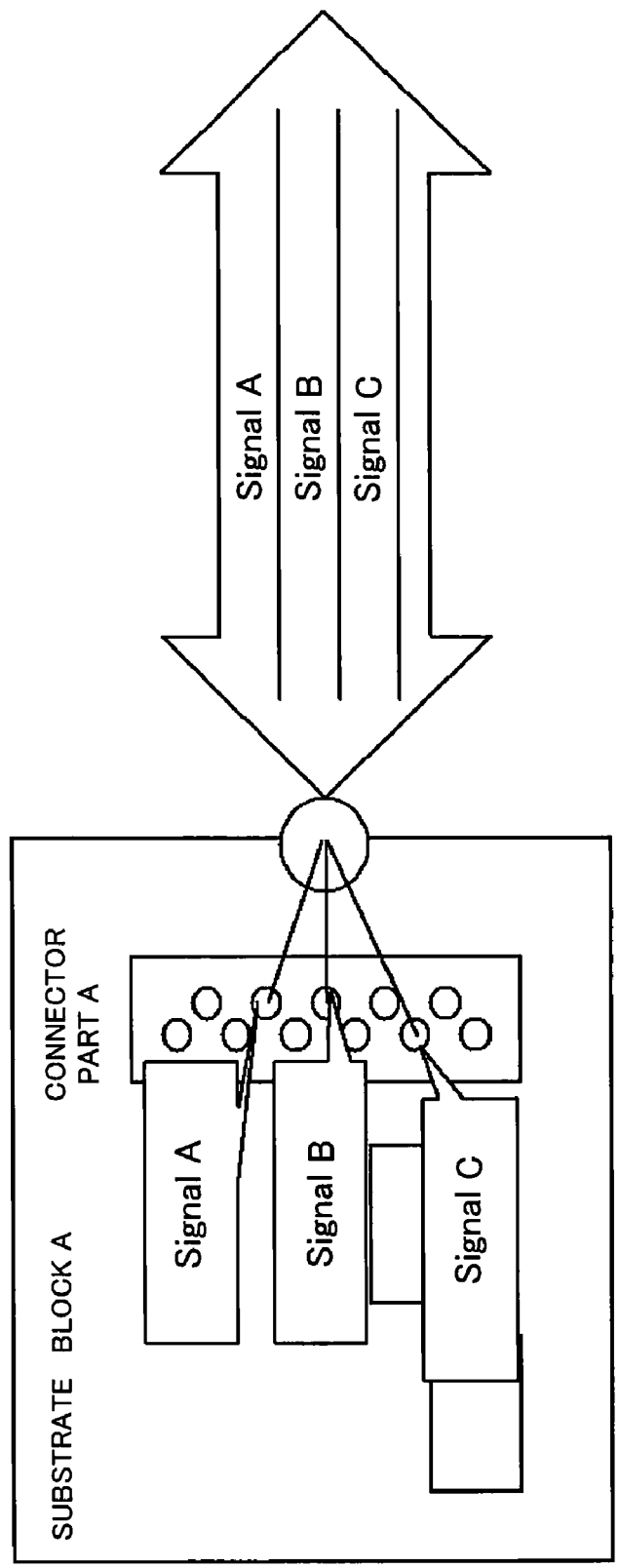
FIG. 22 is an explanatory view of the connecting part generating processing according to the present invention.

Further, since signals are allocated for the terminals of connector parts, it becomes possible to specifically refer to which signal of the inter-substrate-block connection is connected to which terminal of which part in the substrate block as shown in FIG. 22.

Furthermore, by using this type of information, it becomes possible to consider detail specification of the inter-substrate-block connection, and it becomes possible to output a list as shown in FIG. 23.

Description will be made more specifically referring to FIG. 19, in which a connector part A and a connector part B are installed to the circuit parts list, and terminals (TermA-1 and TermA-2, TermB-1 and TermB-2) are respectively installed to the connector part A and the connector part B by the number of signals that the connection A being the inter-substrate-block connection has.

Either one of the signals (SignalB and SignalC) that the connection A being the inter-substrate-block connection has is allocated for the installed terminals, and circuit terminal lists are installed to the substrate terminals (X,Y) in the substrate block lists.

Herein, signals are temporarily allocated for each terminal of each connector part, and are set as a terminal list and a signal list in the order that they were stored in the database in the processing of subsequent step S216.

Furthermore, the terminal lists that were installed to connector parts (A,B) in the circuit parts list are also installed to the substrate terminals (X,Y) in the substrate block lists as a circuit terminal list, terminal TermA-1 and TermA-2 are installed to the circuit terminal list installed to the substrate block A, and TermB-1 and TermB-2 are installed to the circuit substrate list installed to the substrate block B.

Then, the terminals (TermA-1, TermA-2, TermB-1 and TermB-2) in the circuit parts list are associated with the circuit terminal lists of the substrate terminals (X,Y) in the substrate block list as reference relation.

Furthermore, because the substrate terminals in the substrate block lists (X,Y) are in the reference relation with the substrate terminals (X,Y) in the inter-substrate-block connection list, the substrate terminals (X,Y) in the connection between substrate block list are associated with the terminals (TermA-1, TermA-2, TermB-1 and TermB-2) in the circuit parts list.

Further, the circuit parts list is installed for the block to the substrate block A in the substrate block list and the connector part A is allocated, and in the substrate block B, the connector part B is added to the circuit parts list that already exists.

These connector parts (A, B) in each substrate block are associated respectively with the connector parts (A,B) in the circuit parts list as reference relation.

Next, when the processing step S214 ends as described above, procedure advances to the processing of step S216, a signal list is displayed by the user's input of a signal list display command by using the pointing device 20 or the character input device 22, the signal list is edited and a processing of changing signal allocation is performed.

Herein, in creating signal list display, a processing below is performed.
(1) Selecting inter-substrate-block connection
(2) Listing signals that belong to connection
(3) Listing substrate terminals that belong to connection
(4) Listing circuit terminals that belong to substrate terminals
(5) Acquire signals associated with circuit terminals
(6) Creating a list using signal names as a key from the lists obtained in (2) and (5) above Description will be made for the case of creating the list of information in the connection A being the inter-substrate-block connection, in which the connection A being the inter-substrate-block connection is selected on the display unit 18 by the pointing device 20 such as a mouse, signals and substrate terminals which belong to the connection A are listed, and circuit terminals that belong to the substrate terminals are listed.

Figure 24:
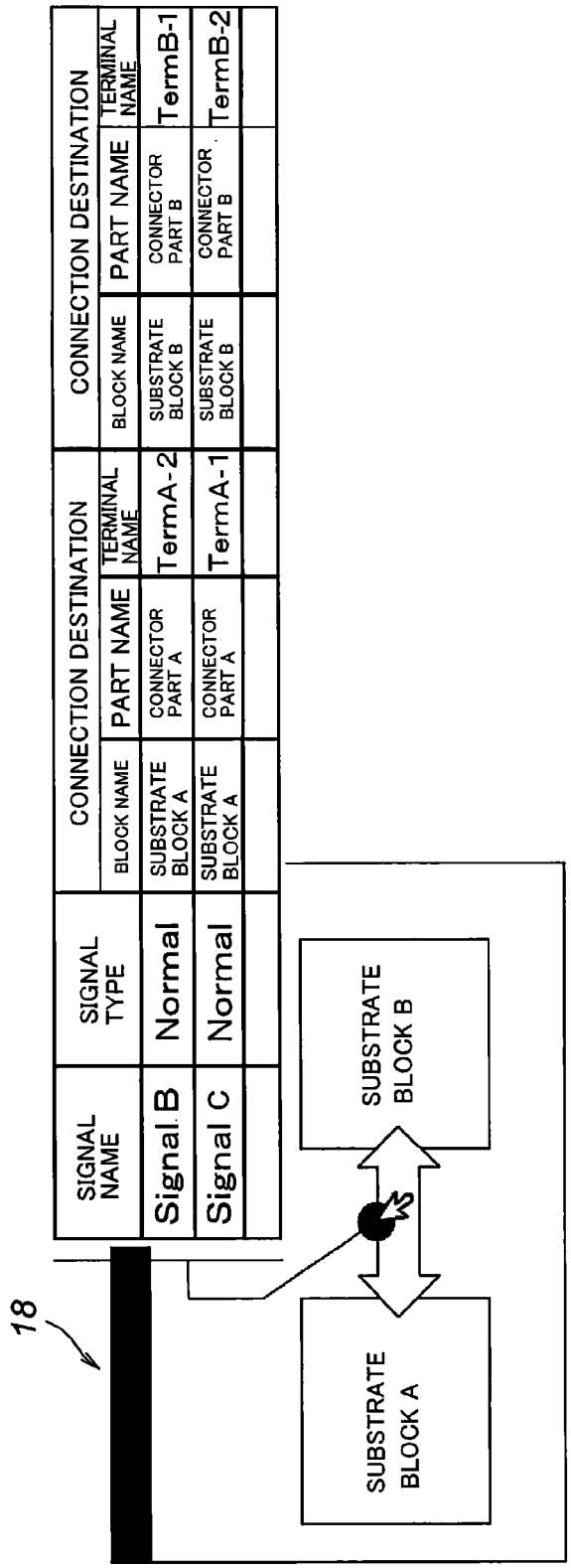
FIG. 24 is a display example of the list of information regarding inter-substrate-block connection.

Furthermore, by performing information organization that signals associated with circuit terminals are acquired by the control of the CPU 12, the list of information in the connection A being the inter-substrate-block connection as shown in FIG. 24 is created and displayed.

Then, by editing the signal list via the control of the CPU 12, terminals of connector parts to which signals are allocated can be changed.

Specifically, for example, setting of terminals that are allocated for the connector parts (A,B), which were built by the connecting part generating processing of step S214, and signals associated with the terminals is performed.

More specifically, by performing such processing, setting is performed as to signal information between substrate blocks, which was associated by the connection A being the inter-substrate-block connection, passes which terminal of which connector part. Specifically, on the display unit 18, as in the table shown in FIG. 25, signals associated with the terminals are changed by exchanging terminals of the connector part A in the substrate block A, and a signal corresponding to each terminal is set.

Further, corresponding to the change of terminals of connector parts that allocate the signals, relation between circuit terminals of connector part and signals is changed on the database by the control of the CPU 12. Specifically, as shown in FIG. 26, signals associated with each terminal in the terminal list of the connector part A in the circuit parts list is changed.

Figure 26:
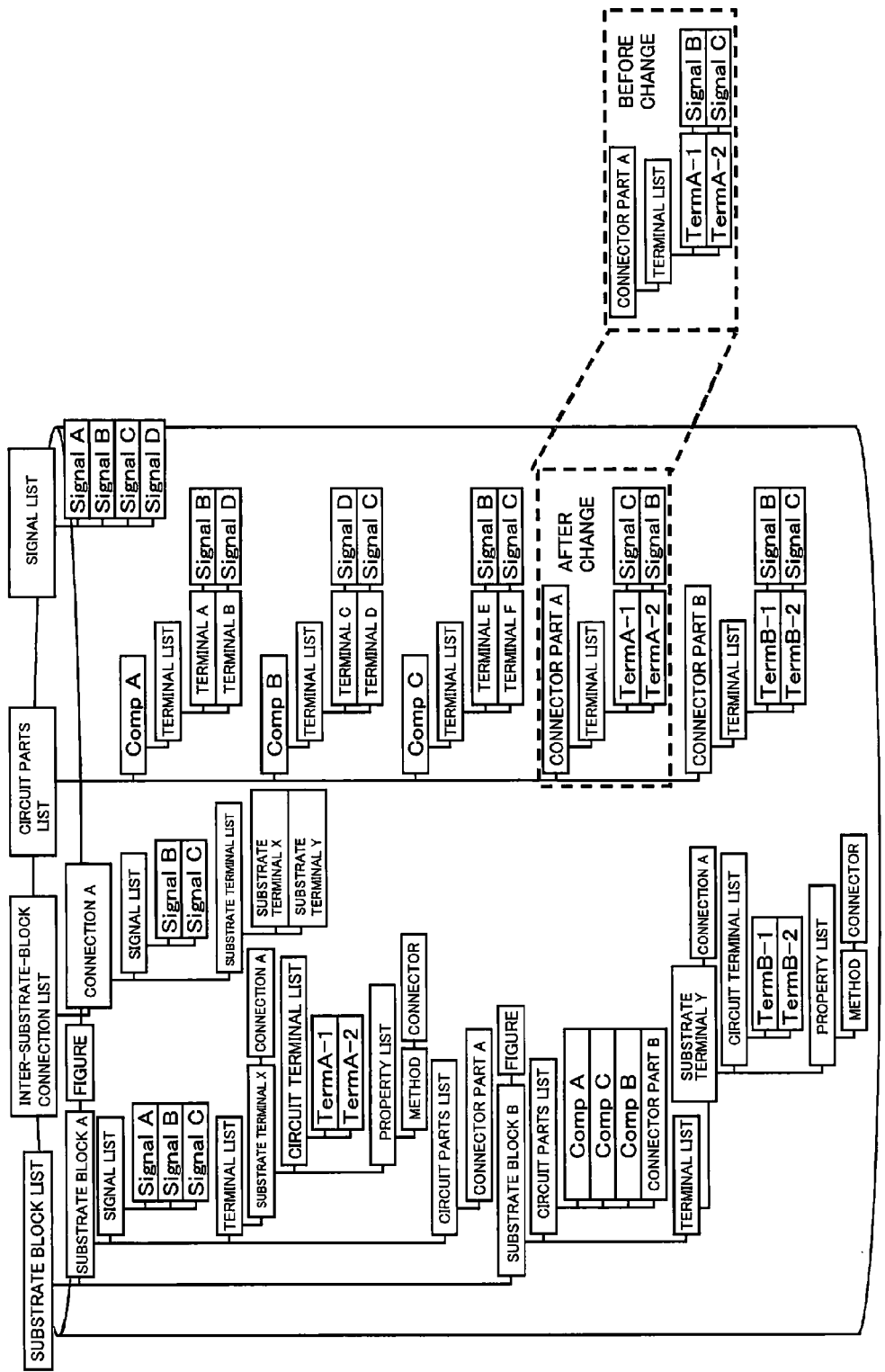
FIG. 26 is a conceptual explanatory view showing a data structure inside the database, which is built after changing the terminals of a connector part to which signals are allocated.

More specifically, by the change of the signal list shown in FIG. 25, a signal corresponding to terminal TermA-1 of the connector part A is changed from SignalB to SignalC, and a signal corresponding to terminal TermA-2 is changed from SignalC to SignalB, in the database (refer to FIG. 26).

Figure 27:
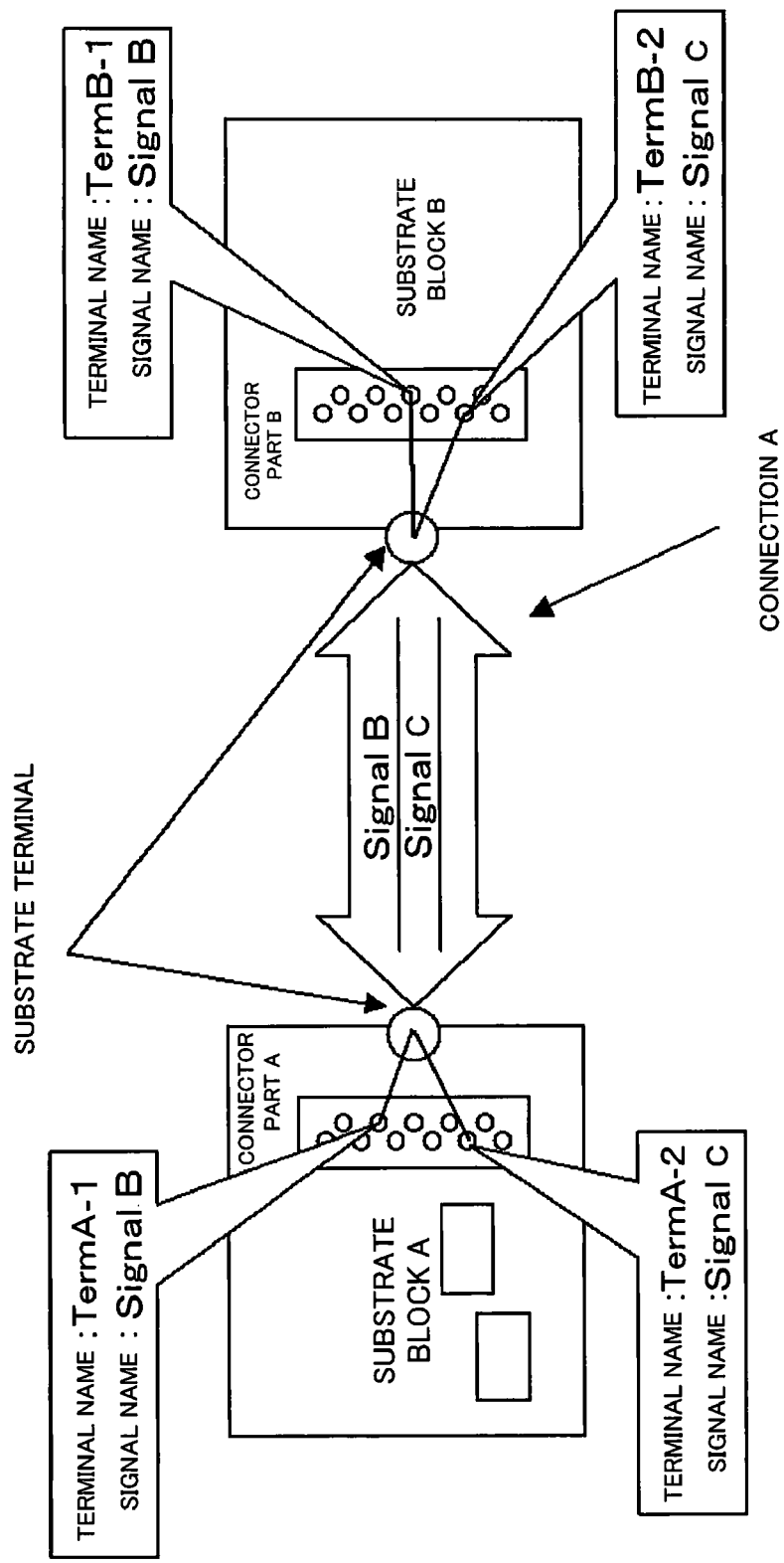
FIG. 27 is an explanatory view of a display example that is displayed on the screen of the display unit by the processing according to the present invention.

Then, as shown in FIG. 27, on the display unit 18, since signals are allocated for each terminal of connector parts, it becomes possible to specifically see that signal SignalB and C of the connection A being the inter-substrate-block connection is connected to which terminal of which part in each substrate block.

Next, when the processing of step S216 ends as described above, procedure advances to the processing of step S218, a processing of outputting the signal list to the outside is performed by the user's input of a signal list output command by using the pointing device 20 or the character input device 22. More specifically, a format is designated, and information of the inter-substrate-block connection is outputted on the designated format.

Specifically, the information of the connection A being the inter-substrate-block connection can be outputted as electronic data on the comma delimited ascii format shown in FIG. 28, for example.

Figure 29:
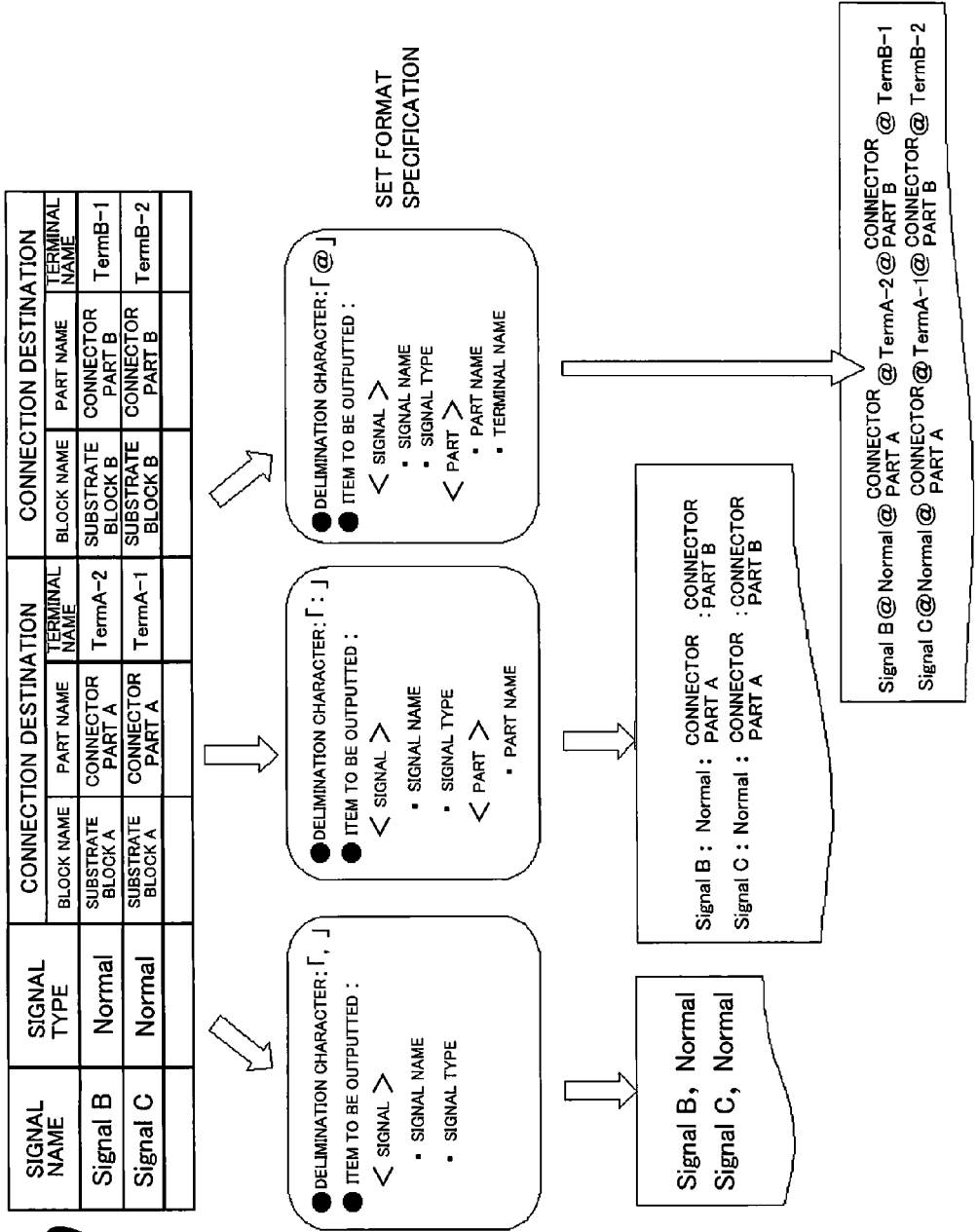
FIG. 29 is another output example in outputting information in inter-substrate-block connection.

It is to be noted that the format used in outputting the signal list to the outside is not limited to the comma delimited ascii format, but a format delimited by colon or at mark as shown in FIG. 29, for example, may be used, and may be selected from the formats.

As described above, according to the electric information processing unit 10 by the present invention, electrical linkage or mounting relation between objects can be expressed, objects and electric information or mounting state attached to the objects can be displayed on the unit of object set by the user.

Further, displayed information of electrical linkage can be displayed on a list, and data of the displayed information of electrical linkage can be outputted by each linkage.

More specifically, according to a conventional printed circuit board CAD, designing methods of a detail level and a schematic level have existed and design has been performed by actually using them, but the two designing methods did not have association with each other (refer to FIG. 30(a)).

In short, although design of the detail level/schematic level existed in the Prior Art and it has actually been performed, it has been impossible to allow the two types of design to have association with each other.

It is to be noted that design of the detail level means the level of design where information regarding the mounting of each constituent item needs to be set to details for the constituent item.

Further, design of the schematic level means the level of design where setting to each constituent item should only be an ambiguous state and design can be performed by rough information only.

However, according to the electric information processing unit 10 by the present invention, both design contents of the detail level and the schematic level are allowed to have association with each other, and the entire design can be moved on while freely selecting the design of the detail level and the design of the schematic level appropriately (refer to FIG. 30(b)).

More specifically, in the present invention, both design contents of the detail level/schematic level are allowed to have association with each other, and the entire design can be moved on while freely alternating between the design of the detail level and the design of the schematic level.

Next, description will be made for the method of connecting a plurality of substrate blocks via connectors and flex substrates (hereinafter, appropriately referred to as "flex substrate") based on electrical connection information, by the electric information processing unit 10 according to the present invention.

Figure 32A:
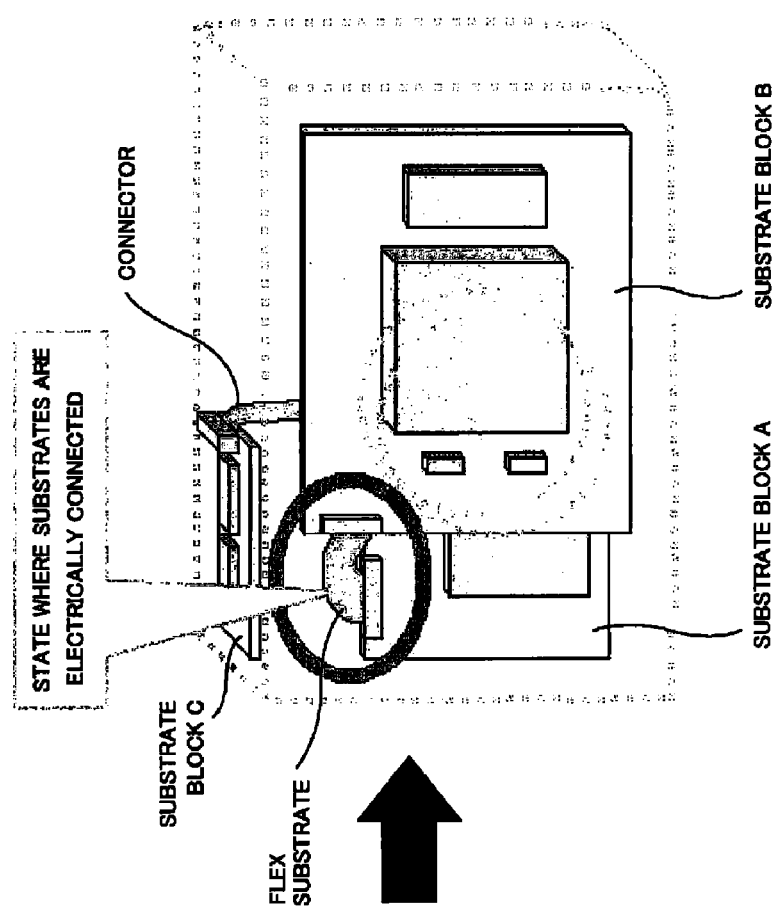
FIGS. 32(a)(b) are explanatory views of the connecting function of a plurality of substrates according to the present invention.
Figure 32B:
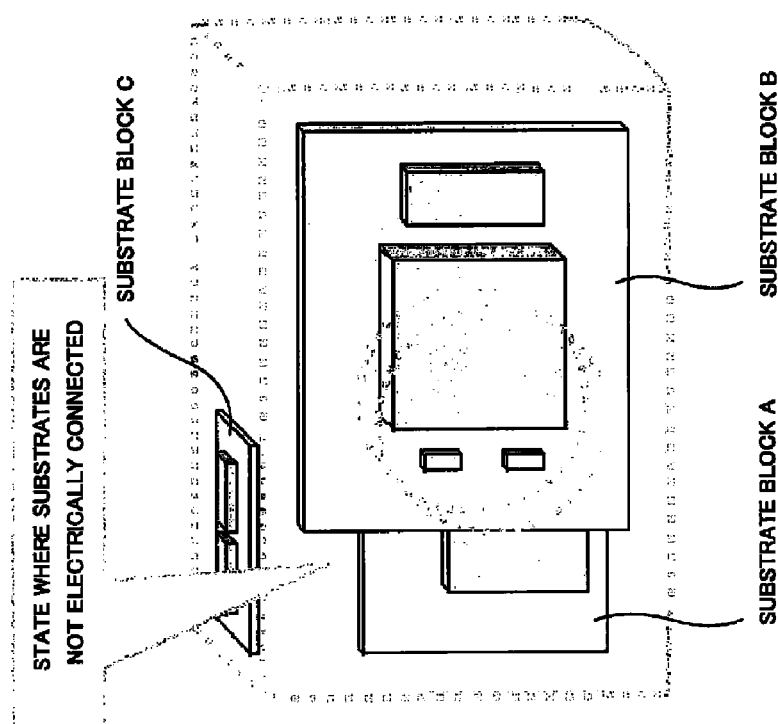

More specifically, description will be made for the method of connecting the substrate block A, the substrate block B and the substrate block C, which are not electrically connected to each other as shown in FIG. 32(a), with a connector and a flex substrate as shown in FIG. 32(a), for example.

Figure 33:
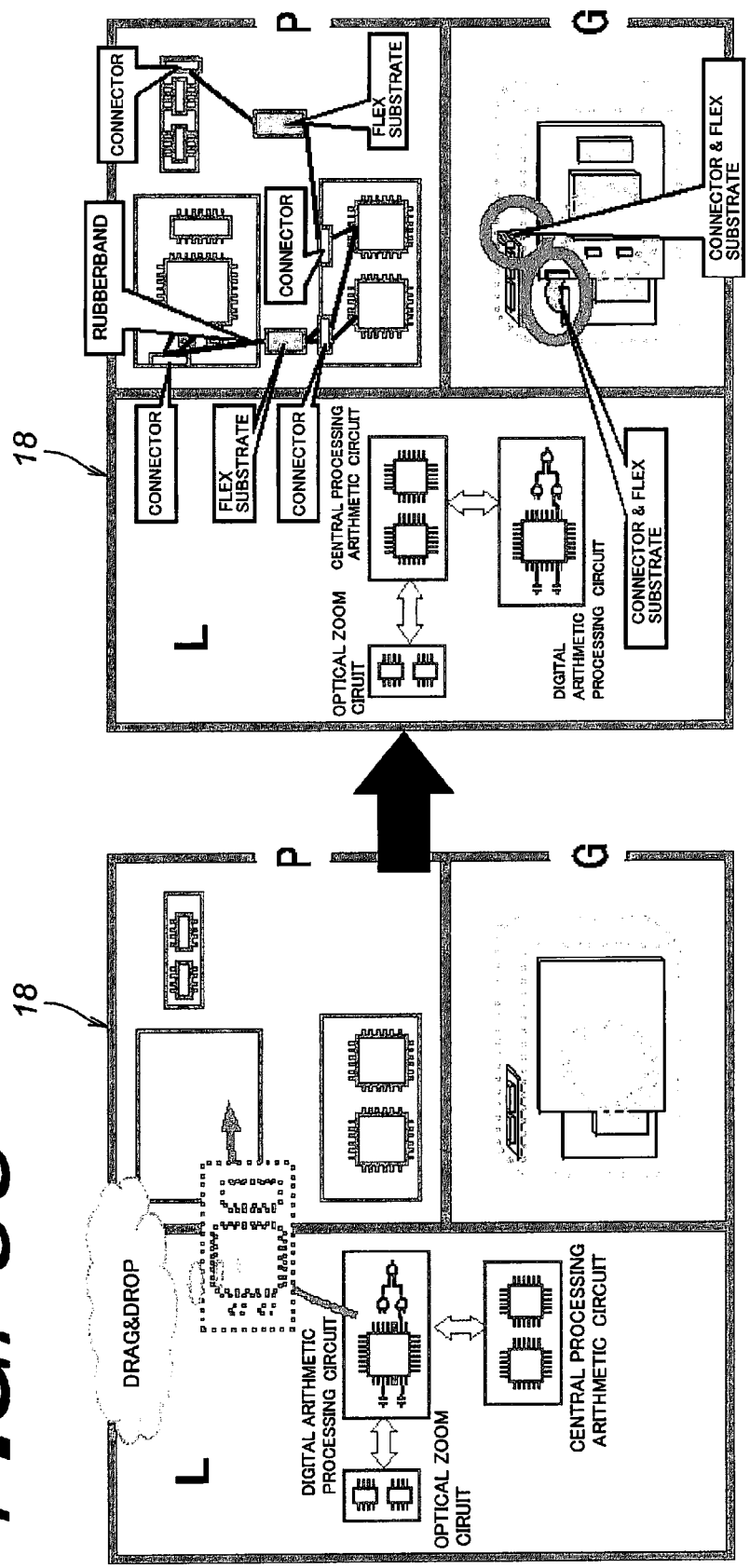
FIG. 33 is an explanatory view of the connecting function of a plurality of substrates according to the present invention.

It is to be noted that a function realized by such a method (hereinafter, appropriately referred to as "connecting function of a plurality of substrates") works in the operation as shown in FIG. 33, for example.

More specifically, FIG. 33 shows a processing in which, on the display unit 18 that is equipped with a screenL (Logical) that displays design information theoretically expressing an electrical operation by a symbolic figure or the like, a screenP (Physical) that displays the contents of physical two-dimensional mounting by a two-dimensional shaped figure, and a screenG (Geometrical) that displays the contents of physical three-dimensional mounting by a three-dimensional shaped figure on a single display screen, a "digital arithmetic processing circuit" of a circuit block is designated on the screenL, the designated "digital arithmetic processing circuit" is arranged on the screenP by drag and drop.

In this processing, electrical connection information defined on the screenL is searched based on instruction coordinates by the pointing device 20 or the character input device 22, connectors and flex substrates are generated and connection information is displayed by rubberband via the connectors and flex substrates on the screenP, and on the screenG, connectors and flex substrates are generated at the same positions as the screenP and a state where connection is made by connectors and flex substrates of three-dimensional shape is displayed.

More particularly, the connecting function of a plurality of substrates works on the screenL when a circuit element or a circuit element group is selected by either method of a to c below and has electrical connection with another substrate on the screenP when parts are arranged on the screenP by drag and drop.

a. Function (circuit) block designation
b. Regional designation
c. Designation of one or more parts Further, as shown in FIG. 34, the connecting function of a plurality of substrates works even after part arrangement.

It is to be noted that displaying rubberband based on connection information without connectors is made possible before executing connection by connectors.

Figure 34:
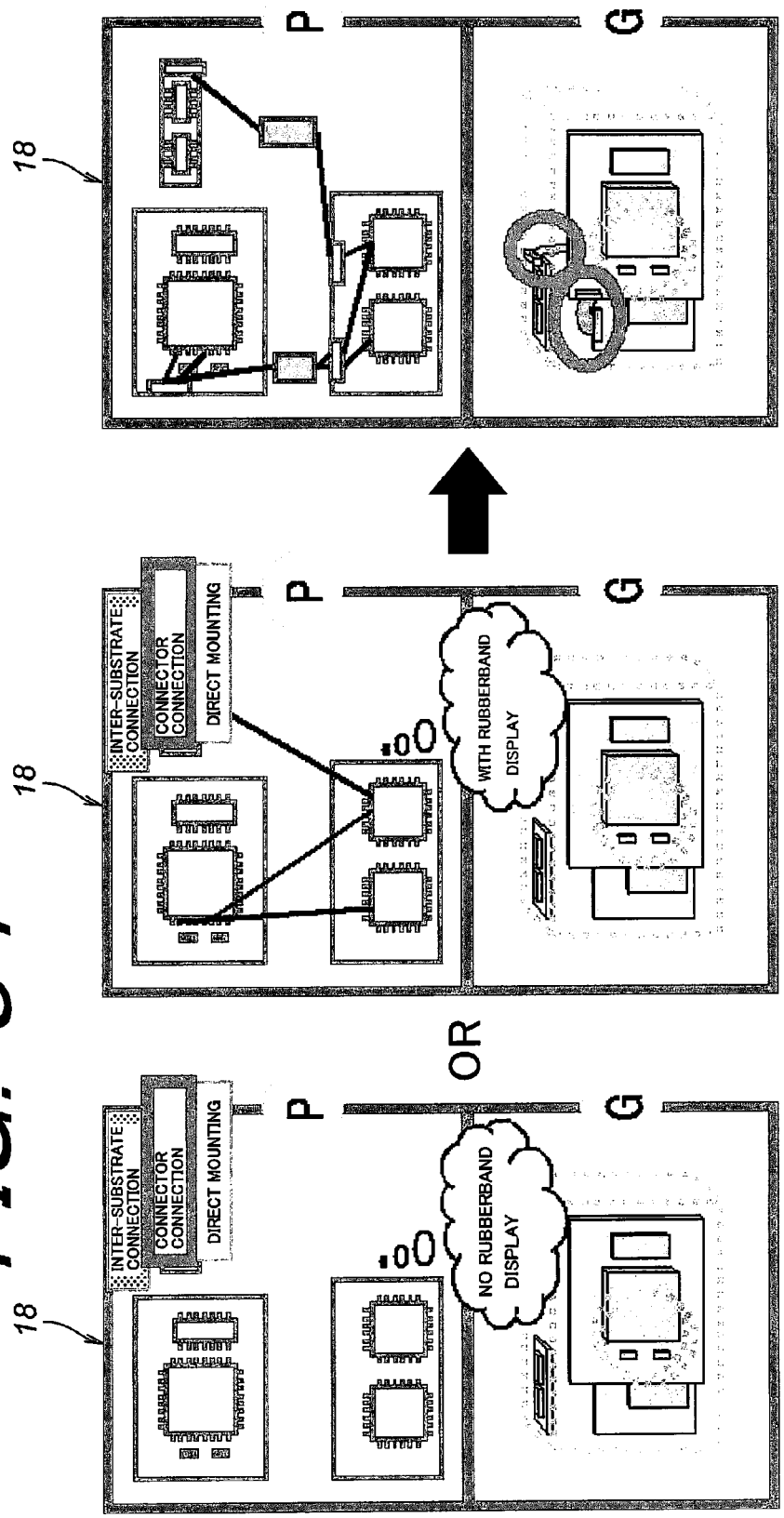
FIG. 34 is an explanatory view of the operation status of the connecting function of a plurality of substrates according to the present invention.

As a result of working of the connecting function of a plurality of substrates, a plurality of substrates are connected to each other on the screenP and screenG as shown in FIG. 34.

Then, in the connecting function of a plurality of substrates, connection among a plurality of substrates is performed taking electrical connection information described below in consideration.

Further, in the connecting function of a plurality of substrates, optimum connectors and flex substrates are generated at optimum positions, and to realize this, the connecting function of a plurality of substrates performs a processing below.

Processing 1: Deciding an optimum connecting medium such as a connector and flex substrate corresponding to the number of signal lines Processing 2: Performing pin assignment that each signal line is connected to the terminals of a connecting medium such as a connector and flex substrate Processing 3: Generating a connector at a position having the shortest route of electric signal With the Processing 1 to Processing 3, optimum connectors and flex substrates are generated at optimum positions.

Figure 35:
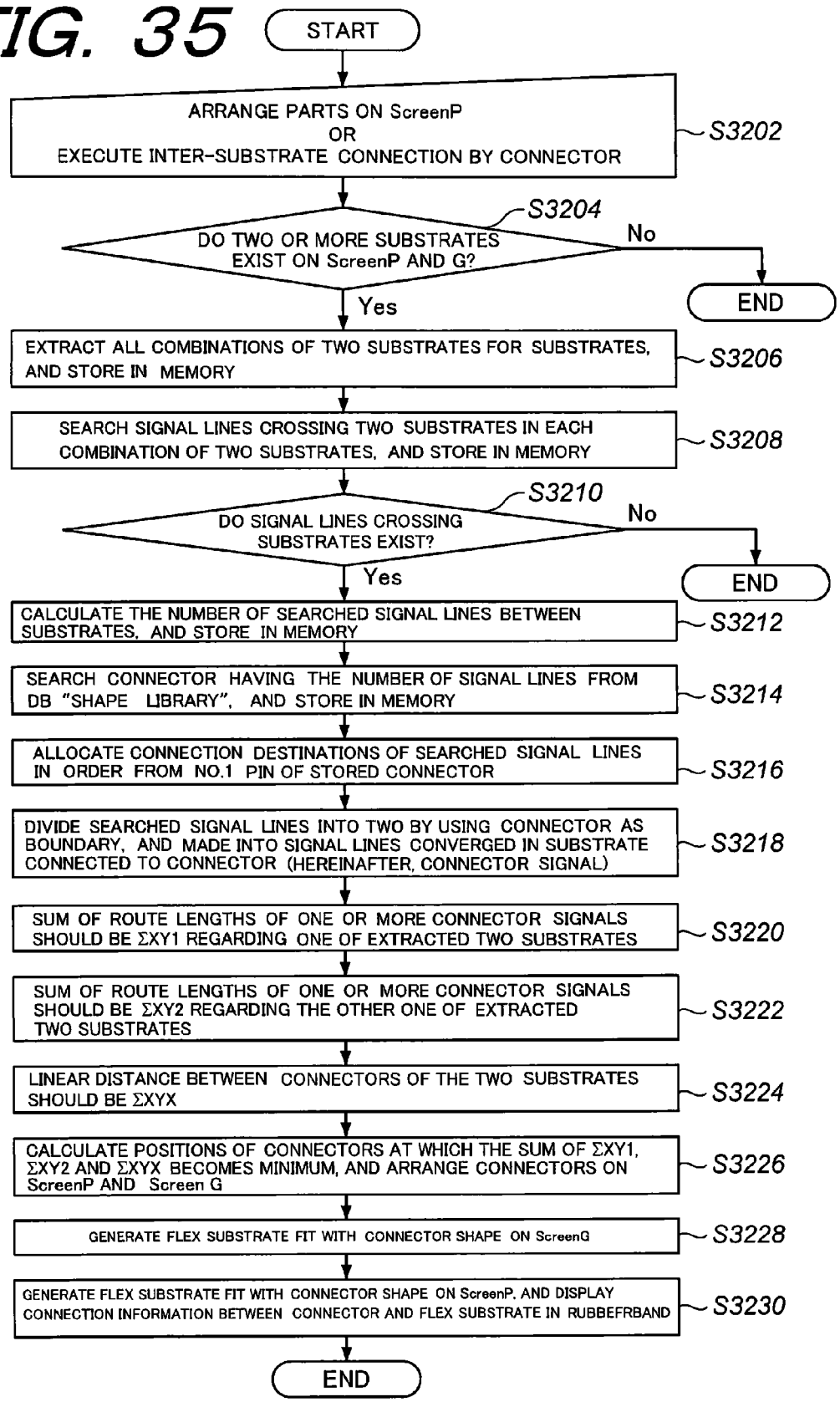
FIG. 35 is a flowchart showing the processing of the connecting function of a plurality of substrates according to the present invention.
Figure 36:
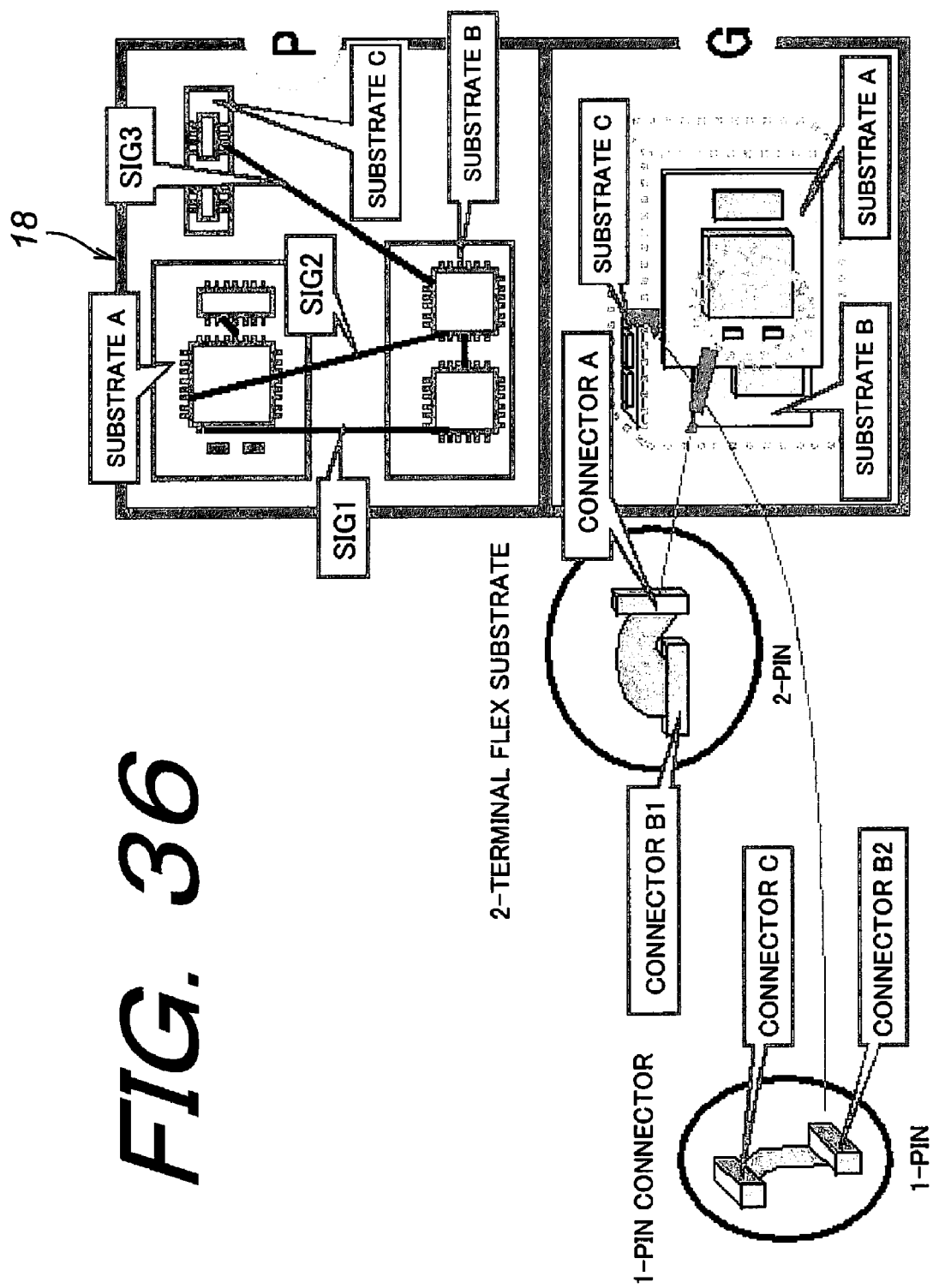
FIG. 36 is an explanatory view of the processing of the connecting function of a plurality of substrates according to the present invention.

Hereinafter, description will be made in detail for each processing of the Processing 1 to 3 while referring to the flowchart shown in FIG. 35 and each drawing shown in FIG. 36 and below.

In the electric information processing unit 10, when the user arranges a part on the screenP or executes inter-substrate connection by connector (step S3202), whether or not two or more substrates exist on the screenP and screenG is judged (step S3204), a processing on and after step S3206 is performed in the case of judgment that two or more substrate exist on the screenP and screenG, and the connecting function of a plurality of substrates works.

Meanwhile, this embodiment takes the case shown in FIG. 36 as an example for easier understanding of the present invention, and description will be made for a processing in which connectors and flex substrates to be generated are decided and connected.

First, description will be made for Processing 1 executed by step S3206 to step S3214.

In this processing 1, all combinations of two substrates are extracted for all substrates first, and the extracted result is stored in the storage 16 (step S3206). In the example shown in FIG. 36, three types of substrates A-B, substrates A-C and substrates B-C are extracted and stored.

When the processing of step S3206 ends, signal lines crossing substrates are searched based on the combinations extracted on step S3204, and in the case where the existence of the signal lines crossing substrates are searched (step S3208, step S3210), the searched result is stored in the storage 16 (step S3212). The followings are signal lines in the example shown in FIG. 36.

Substrates A-B→SIG1, SIG2 (Two signal lines)
Substrates A-C→None
Substrates B-C→SIG3 (One signal line)

Then, connectors and flex substrates having the number of pins corresponding to the number of signal lines, which were stored in the storage 16 on step S3212, connectors and flex substrates corresponding to the number of signal lines stored in the storage 16 on step S3212 are decided and stored in the storage 16 while a shape library of database (described later) is searched (step S3214). In the example shown in FIG. 36, connectors and flex substrates between each substrate are decided as follows based on the number of searched signal lines.

Between substrates A-B: 2-pin connector, 2-terminal flex substrate

Between substrates A-C: No connector and flex substrate

Between substrates B-C: 1-pin connector, 1-terminal flex substrate

Next, description will be made for Processing 2 executed on step S3216, in which connecting destinations of signal lines searched on step S3208 to step S3212 are allocated in order from the first one of the pins of the connector stored on step S3214 (step S3216).

Figure 37:
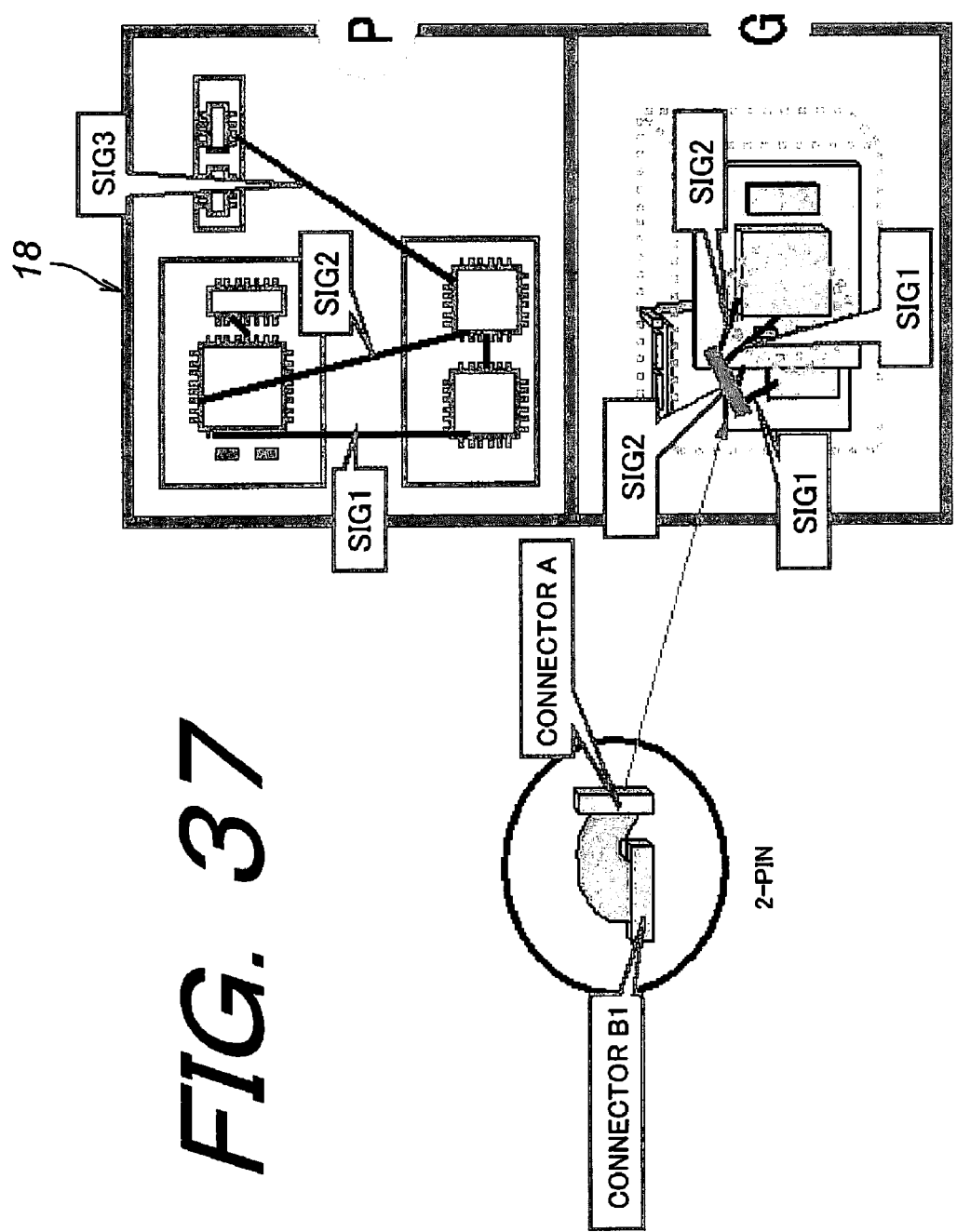
FIG. 37 is an explanatory view of the processing of the connecting function of a plurality of substrates according to the present invention.

More specifically, description will be made for Processing 2 of pin assignment of each signal line on step S3216 by using FIG. 37 as an example, in which the searched signal lines are allocated in order from the first pin of the connector. Specifically, assuming that the signal lines are searched in the order of SIG1, SIG2 and SIG3, pin assignment of signal lines passing through the terminals below, and setting of connection information and connector pin is performed.

SIG1→First pin of connector A, First pin of connector B1
SIG2→Second pin of connector A, Second pin of connector B1
SIG3→First pin of connector B2, First pin of connector C Next, description will be made for Processing 3 executed on step S3218 to step S3230.

Figure 38:
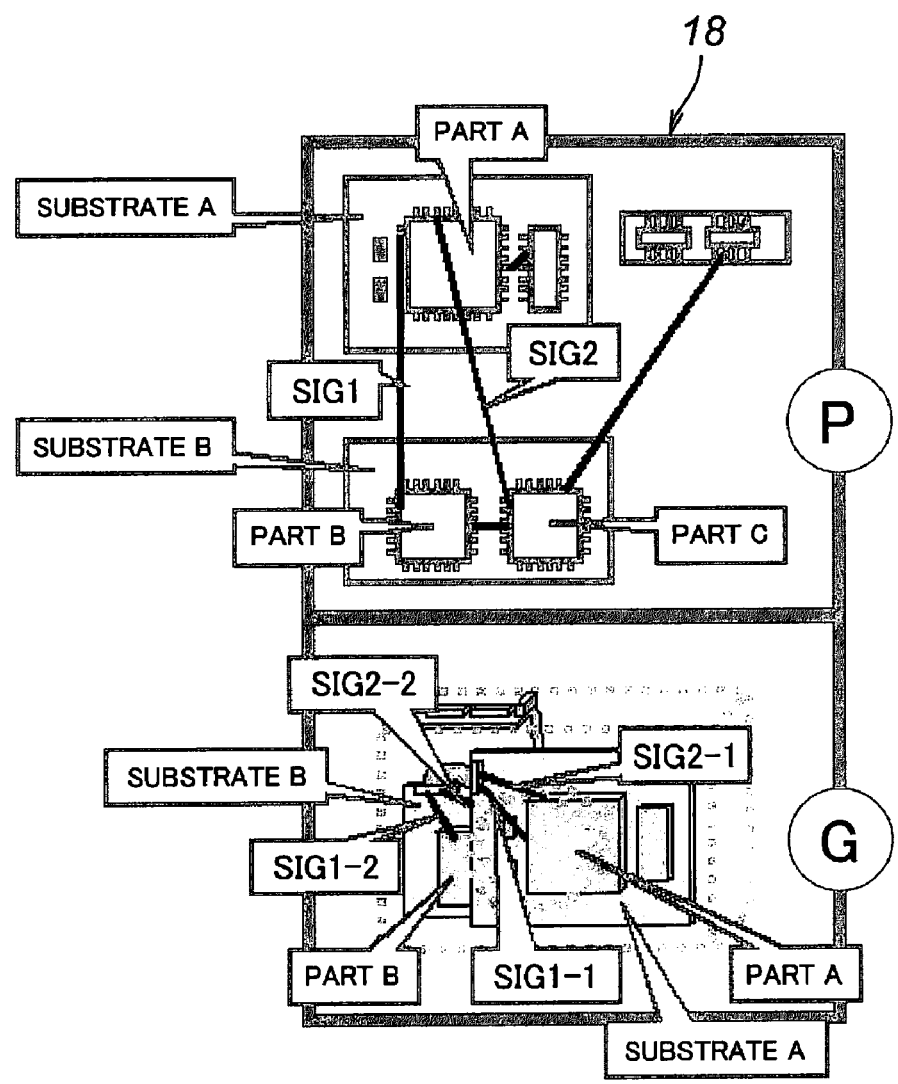
FIG. 38 is an explanatory view of the processing of the connecting function of a plurality of substrates according to the present invention.

In the explanation of this processing 3, on step S3218 first, the signal lines searched on step S3208 to step S3212 are divided into two by using a connector as a boundary, and made into signal lines converged in a substrate connected to the connector (hereinafter, appropriately referred to as "connector signal"). Specifically, as shown in FIG. 38, this explains a processing in which the position of a connector, by which the substrate A and the substrate B are connected, are decided, and the signal line between part A and part B, which is SIG1, is made into SIG1-1 and SIG1-2 by using the connector as a boundary. Similarly, SIG2 is made into SIG2-1 SIG2-2 by using the connector as a boundary.

Next, on step S3220, regarding one of two substrates extracted on step S3206, the sum of route lengths of one or more connector signals should be ΣXY1.

When it is explained according to the example shown in FIG. 38, a signal route length within substrate A is calculated.

Figure 39:
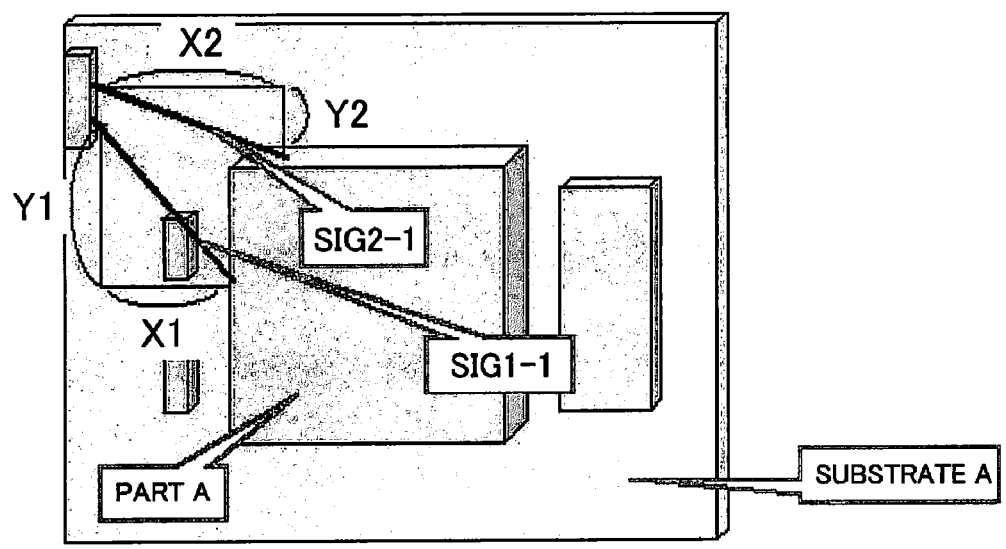
FIG. 39 is an explanatory view of the processing of the connecting function of a plurality of substrates according to the present invention.

Herein, the signal route length within substrate A is as follows assuming that the bending angle of a signal pattern be 90 degrees as shown in FIG. 39.

Signal route length within substrate A=Signal route length of SIG1-1+Signal route length of SIG2-1= (X1+Y1)+(X2+Y2)

When the processing of step S3220 ends, procedure advances to the processing of step S3222, the sum of route lengths of one or more connector signal regarding the other one of two substrates extracted step S3206 should be ΣXY2.

When it is explained according to the example shown in FIG. 38, a signal route length within substrate B is calculated.

Figure 40:
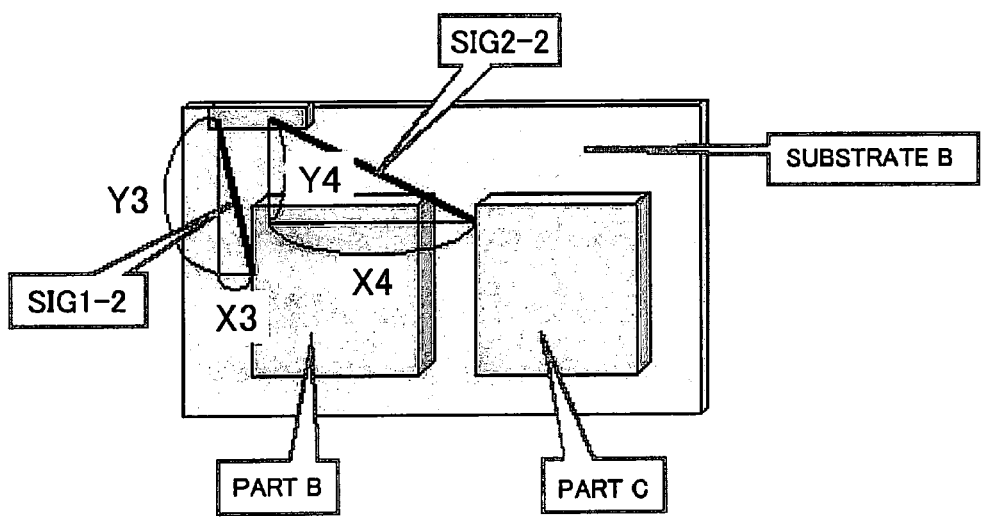
FIG. 40 is an explanatory view of the processing of the connecting function of a plurality of substrates according to the present invention.

Herein, the signal route length within substrate B is as follows assuming that the bending angle of a signal pattern be 90 degrees as shown in FIG. 40.

Signal route length within substrate B=Signal route length of SIG1-2 +Signal route length of SIG2-2=(X3+Y3)+(X4+Y4)

When the processing of step S3222 ends, procedure advances to the processing of step S3224, and a linear distance between connectors of two substrates should be ΣXYX.

Figure 41:
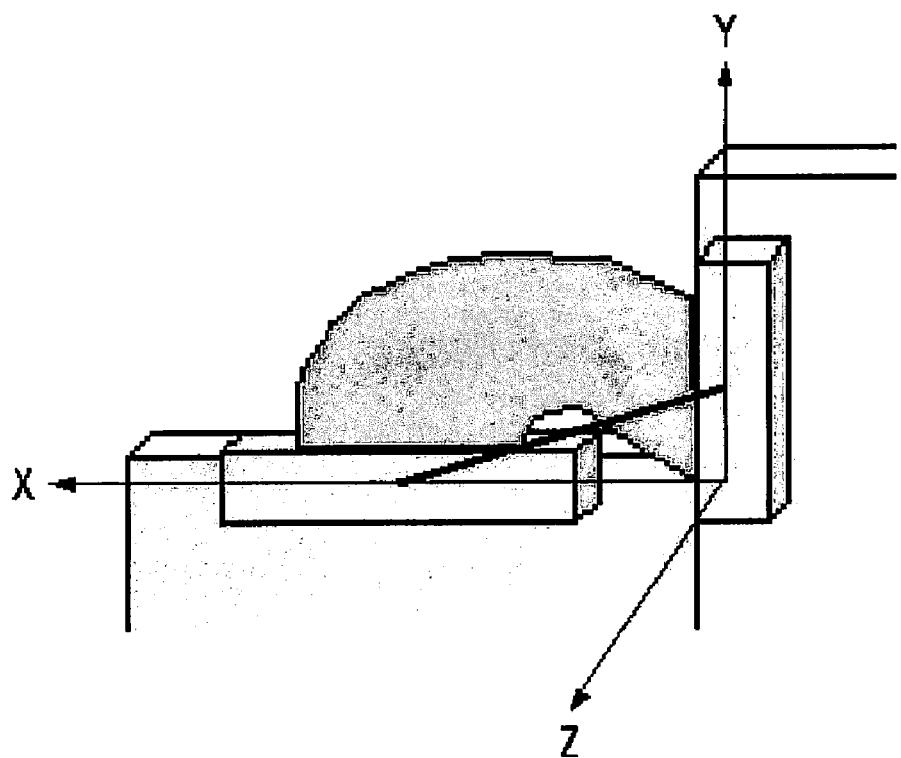
FIG. 41 is an explanatory view of the processing of the connecting function of a plurality of substrates according to the present invention.

When it is explained according to the example shown in FIG. 41, a signal route length between the substrate A and the substrate B is calculated. Herein, the signal route length between the substrate A and the substrate B is as follows assuming that it is a linear line route connecting centers of two connectors.

Signal route length=$(X5^2+Y5^2+Z5^2)^{1/2}$

When the processing of step S3224 ends, procedure advances to the processing of step S3226, the positions of connectors at which the sum of ΣXY1, ΣXY2 and ΣXYX becomes the minimum is calculated, and the connectors are arranged on the screenP and screenG.

When it is explained according to the above-described example, the signal route length between the substrate A and the substrate B is as follows from the above.

Signal route length=Signal route length within substrate A+Signal route length within substrate B+Signal route length between substrates A and
B=$(X1+Y1)+(X2+Y2)+(X3+Y3)+(X4+Y4)+(X5^2+Y5^2+Z5^2)^{1/2}$ Positions at which the signal route length becomes the minimum are calculated based on the equation above, and the connectors are arranged.

When the processing of step S3226 ends, a flex substrate fit with a connector shape is generated on the screenG (step S3228), and then, a flex substrate fit with a connector shape is generated on the screenP, connection information between the connector and the flex substrate are displayed by rubberband (step S3230), and this processing ends.

Figure 42:
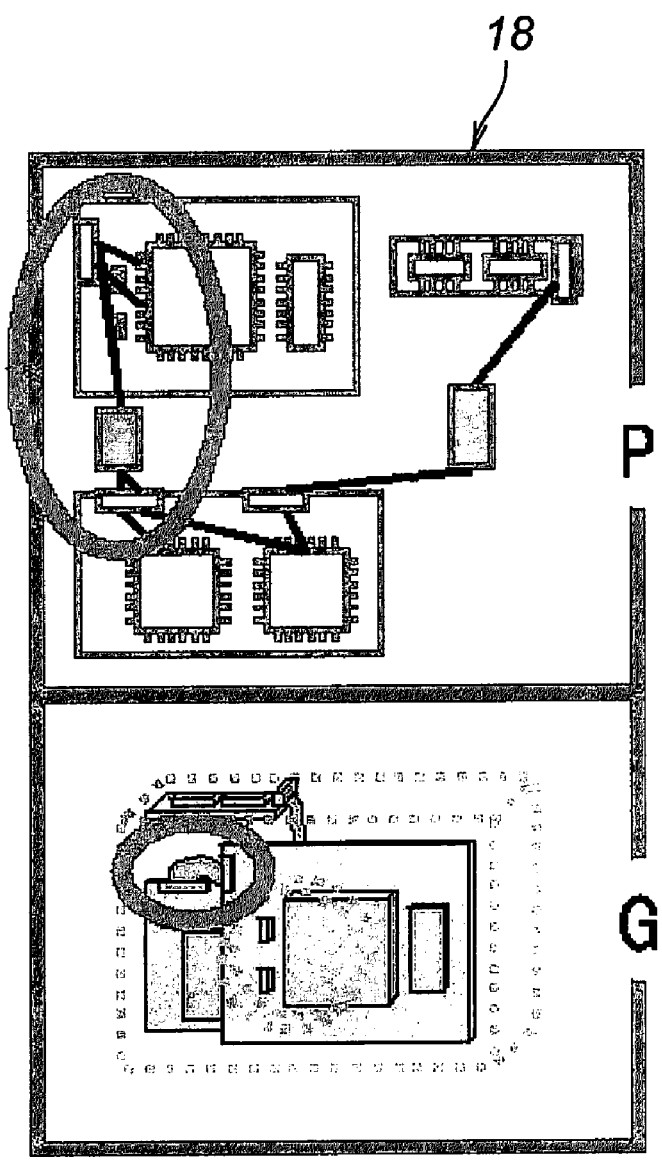
FIG. 42 is an explanatory view of the processing of the connecting function of a plurality of substrates according to the present invention.

When it is explained according to the above-described example, the flex substrate is generated in a width corresponding to a connector width (pin shape), electrical connection information of the connector and the flex substrate is displayed as rubberband on the screenP, and the state where physical connection by the connector and the flex substrate is displayed in a three-dimensional shape on the screenG as shown in round frames of FIG. 42.

Figure 43:
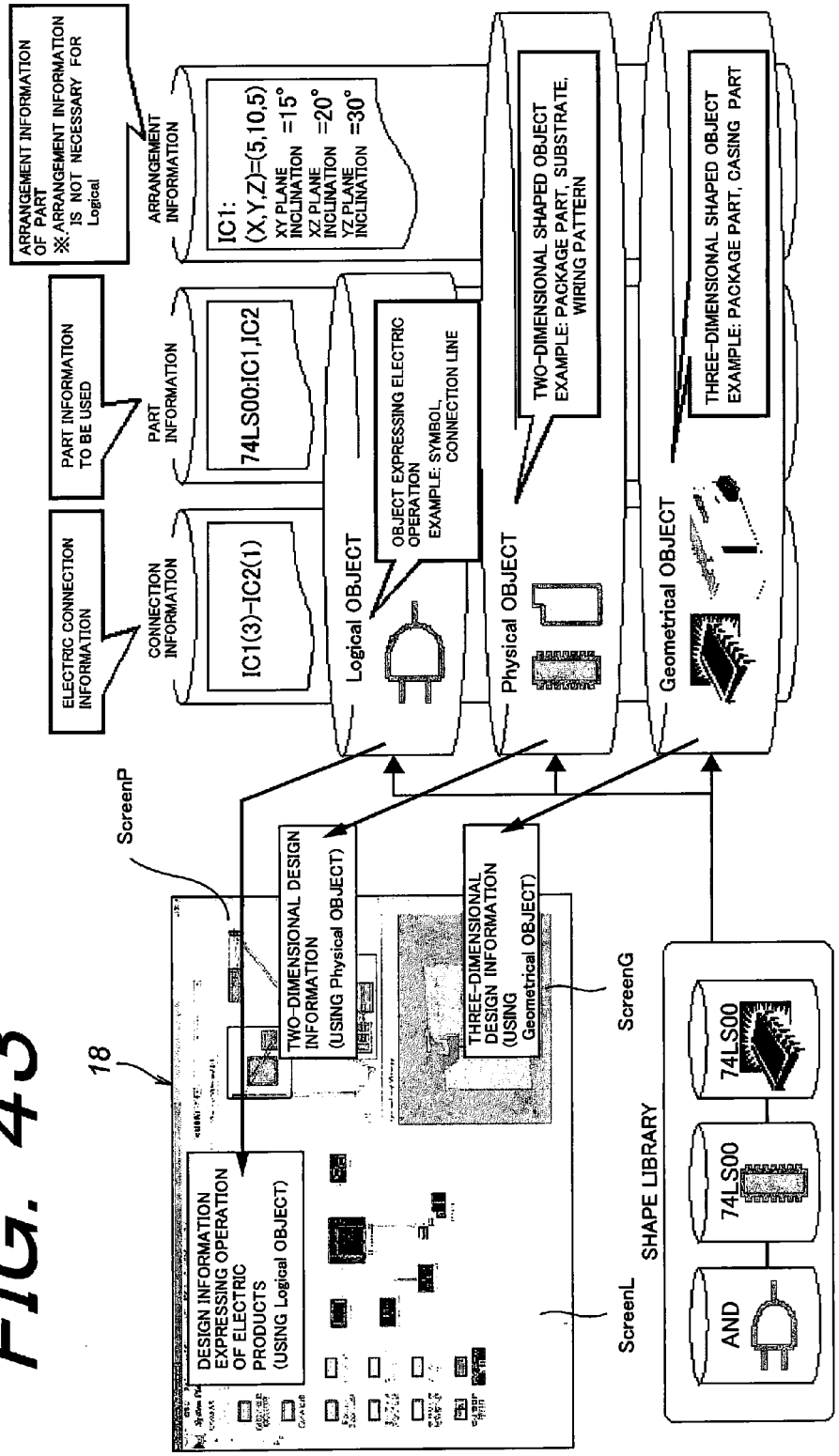
FIG. 43 is an explanatory view showing the database structure of a database stored in a storage that is used for the processing of the connecting function between a plurality of substrates according to the present invention.

Meanwhile, information used in the series of processing of Processing 1 to Processing 3 is stored in the storage 16 in the form of database structure shown in FIG. 43, and the actual processing is performed by utilizing the information of this database structure.

It is to be noted that the database structure shown in FIG. 43 has nine pieces of information in total below.

Three pieces of information displayed on three operation screens called a screenL, a screenP and a screenG screen Three pieces of information called connection information, part information and arrangement information which are shared by a screenL, a screenP and a screenG Three shape libraries called symbol, two-dimensional shape and three-dimensional shape It is to be noted that the above-described embodiment may be modified into (1) to (4).

(1) In the above-described embodiment, the printed circuit board was cited as the object, and electric signal between printed circuit boards was dealt with. However, it goes without saying that the invention is not limited to this, and electric information between various objects such as chassis, chassis part, module, unit, interconnect, electrons substrate, chip and circuit part, for example, may be dealt with.

Specifically, electric information between package substrates of smaller scale than the printed circuit board, electric information between units of larger scale than the printed circuit board, and furthermore, electric information between various objects of different types such as between the printed circuit board, the package substrate and the unit may be dealt with.

Meanwhile, in the package substrate and the unit, FIG. 31 shows each name corresponding to the substrate blocks, circuit parts and the like in the above-described embodiment.

Further, by combining these modules, it becomes possible to constitute electronic parts assembled into various products, small electronic equipment such as a digital camera and a cell phone, large electronic equipment such as a television and an audio system, automobiles, railways, industrial appliance and the like, for example.

(2) In the above-described embodiment, a substrate block was created by newly inputting substrate figures in inputting the substrate block. However, it goes without saying that the invention is not limited to this, and existing data to which electric information or the like was already inputted by another CAD may be used. In this case, regarding a processing after inputting a substrate block, an operator appropriately may select necessary processing to move on design work.

(3) In the above-described embodiment, description was made for the case where the processing of step S202 to step S218 was performed in order as a series of flow for easier understanding of the present invention. However, not limited to this, and the user may perform a desired processing individually and independently out of the processing of these step S202 to step S218.

(4) The above-described embodiment and the modified examples shown in (1) to (3) above may be appropriately combined.

Industrial Applicability

The present invention can be utilized in performing design of various products equipped with electrical connection relation.

The invention claimed is:

1. An electric information processing method in a CAD system, said electric information processing method performed by using a computer, comprising:
    a first processing in which, regarding a plurality of objects that are constituent parts for designing electronic products, the shapes of inputted objects are displayed on a screen;
    a second processing in which signal information being electric information is inputted to the objects displayed by said first processing;
    a third processing in which circuit parts being objects arranged on predetermined objects in an overlapped manner and said predetermined objects, out of the objects displayed by said first processing, are allowed to be electrically connected, and said predetermined objects and said circuit parts are virtually unified;
    a fourth processing in which, based on electric information in said each object of said circuit parts being objects virtually unified by said third processing and the objects inputted by said first processing except for predetermined objects being said virtually unified objects, said objects that should be electrically connected are connected by straight lines;
    a fifth processing in which a figure inputted by a user is displayed as a figure that physically connects between said plurality of objects based on the straight lines connected by said fourth processing;
    a processing in which inter-substrate connection information of said inputted figures is stored, and the fact that said connected objects have inter-substrate connection is stored;
    a sixth processing in which types of connection condition of terminals for connecting between said plurality of objects is inputted to the figures inputted by said fifth processing;
    a seventh processing in which circuit parts for connection are built according to the connection condition inputted by said sixth processing; and
    a eighth processing in which signal information is set to the terminals of said circuit part built by said seventh processing.

2. The electric information processing method in a CAD system according to claim 1, wherein
    objects having the closest arrangement distance out of said plurality of objects are electrically connected in said fourth processing.

3. The electric information processing method in a CAD system according to claim 1, wherein said fourth processing changes the straight lines expressing the connection information based on electrical connection information between said plurality of objects.

4. An electric information processing unit in a CAD system, comprising:
first display means for displaying the shapes of inputted objects on a screen, regarding a plurality of objects that are constituent parts for designing electronic products:
first input means for inputting signal information that are electric information to the objects displayed by said first display means;
unifying means for electrically connecting and virtually unifying predetermined objects and said circuit parts being objects, allowing circuit parts being objects arranged on predetermined objects in an overlapped manner and said predetermined objects, out of the objects displayed by said first display means;
means for connecting by straight lines, based on electric information in said each object of said circuit parts being objects virtually unified by said unifying means and said inputted objects in said first display means except for said predetermined objects being said objects virtually unified by said unifying mean;
second display means for displaying a figure inputted by a user as a figure that physically connects between said plurality of objects based on the straight lines connected by said means for connecting by straight lines;
means for storing inter-substrate connection information of said inputted figures, and storing the fact that said connected objects have inter-substrate connection;
second input means for inputting types of connection condition of terminals for connecting between said plurality of objects to the figure inputted by said second display means;
circuit part building means for building circuit parts for connection according to the connection condition inputted by said second input means; and
signal information setting means for setting signal information to the terminals of said circuit part built by said circuit part building means.

5. The electric information processing unit in a CAD system according to claim 4, wherein
objects having the closest arrangement distance out of said plurality of objects are electrically connected.

6. The electric information processing unit in a CAD system according to claim 4, said unit further comprising:
display means for displaying at least said objects and said straight lines, wherein based on electrical connection information between said plurality of objects, straight lines expressing connection information are changed and displayed.

7. A program recorded in an non-transitory computer readable storage medium that allows a computer to execute the electric information processing method in a CAD system according to claim 1.

8. A program recorded in an non-transitory computer readable storage medium that allows a computer to function as the electric information processing unit in a CAD system according to claim 4.

9. A non-transitory computer-readable storage medium in which the program according to claim 7 is recorded.

10. A non-transitory computer-readable storage medium in which the program according to claim 8 is recorded.

* * * * *